(12) United States Patent
Singh et al.

(10) Patent No.: US 9,029,759 B2
(45) Date of Patent: May 12, 2015

(54) COMPACT CAMERA MODULES WITH FEATURES FOR REDUCING Z-HEIGHT AND FACILITATING LENS ALIGNMENT AND METHODS FOR MANUFACTURING THE SAME

(75) Inventors: Harpuneet Singh, Dublin, CA (US); Giles Humpston, Buckinghamshire (GB); Ellis Chau, San Jose, CA (US); Eddie Azuma, San Jose, CA (US); Peter Pietrangelo, San Jose, CA (US); Ocie Ward, Petaluma, CA (US)

(73) Assignee: Nan Chang O-Film Optoelectronics Technology Ltd, Nanchang (CN)

( * ) Notice: Subject to any disclaimer, the term of this patent is extended or adjusted under 35 U.S.C. 154(b) by 252 days.

(21) Appl. No.: 13/445,857

(22) Filed: Apr. 12, 2012

(65) Prior Publication Data

US 2013/0270419 A1    Oct. 17, 2013

(51) Int. Cl.
| | | |
|---|---|---|
| *H01J 5/02* | (2006.01) | |
| *H01L 31/0232* | (2014.01) | |
| *H01L 27/146* | (2006.01) | |
| *H04N 5/225* | (2006.01) | |

(52) U.S. Cl.
CPC .... *H01L 31/02327* (2013.01); *H01L 27/14618* (2013.01); *H01L 27/14625* (2013.01); *H01L 27/14685* (2013.01); *H04N 5/2257* (2013.01)

(58) Field of Classification Search
USPC .............. 250/208.1, 239, 216; 396/111, 129, 396/529–535; 257/440, 432–436; 348/340, 348/360, 361, 374
See application file for complete search history.

(56) References Cited

U.S. PATENT DOCUMENTS

| | | | |
|---|---|---|---|
| 7,368,695 B2 | 5/2008 | Kang et al. | |
| 7,405,764 B2 | 7/2008 | Gustavsson et al. | |
| 7,780,365 B2* | 8/2010 | Woo | 396/529 |
| 7,936,062 B2 | 5/2011 | Humpston et al. | |
| 8,093,092 B2 | 1/2012 | Singh et al. | |
| 2002/0006687 A1 | 1/2002 | Lam | |
| 2003/0162313 A1 | 8/2003 | Kim et al. | |
| 2004/0189862 A1 | 9/2004 | Gustavsson et al. | |
| 2007/0146534 A1* | 6/2007 | Kim et al. | 348/340 |
| 2007/0217786 A1 | 9/2007 | Cho et al. | |

(Continued)

FOREIGN PATENT DOCUMENTS

| | | |
|---|---|---|
| WO | 2011/152653 A2 | 12/2011 |
| WO | 2013/155240 A2 | 10/2013 |

OTHER PUBLICATIONS

PCT Notification of Transmittal of the International Search Report and the Written Opinion of the International Searching Authority, or the Declaration, for PCT Application No. PCT/US2013/036054, report dated Oct. 1, 2013, 23 pages.
PCT Invitation to Pay Additional fees and, Where Applicable, Protest Fee, for PCT Application No. PCT/US2013/036054, dated Jul. 10, 2013, 2 pages.

*Primary Examiner* — Que T Le
(74) *Attorney, Agent, or Firm* — Novak Druce Connolly Bove + Quigg LLP

(57) ABSTRACT

A miniature camera module component is formed by creating replicated lens shapes on a protective cover wafer and depositing material to form multiple cavities with the replicated lens shapes respectively disposed therein. A carrier wafer is coupled to the protective cover wafer before it is diced. An intermediate wafer is coupled to the protective cover wafer, and the carrier wafer is removed. An image sensor wafer is coupled to the protective cover wafer, and the intermediate wafer is removed.

46 Claims, 20 Drawing Sheets

(56) References Cited

U.S. PATENT DOCUMENTS

| | | |
|---|---|---|
| 2009/0021624 A1 | 1/2009 | Westerweck et al. |
| 2009/0213262 A1 | 8/2009 | Singh et al. |
| 2009/0230499 A1 | 9/2009 | Warsop et al. |
| 2009/0309177 A1 | 12/2009 | Jeung et al. |
| 2011/0019282 A1 | 1/2011 | Lusinchi et al. |
| 2011/0059572 A1 | 3/2011 | Brady |
| 2011/0242676 A1 | 10/2011 | Lee |
| 2011/0317291 A1 | 12/2011 | Lee |
| 2012/0025787 A1 | 2/2012 | Rouvala et al. |

* cited by examiner

Step 1: Glass wafer or Blue glass wafer

Step 2: IR coating of glass wafer (Top side) only in case of plain glass.
Step not needed for blue glass wafer Step 3: Replicated lens shape on bottom side Step 4: Formation of cavity using epoxy (by masking the active image area corresponding to the actual image area on image sensor)

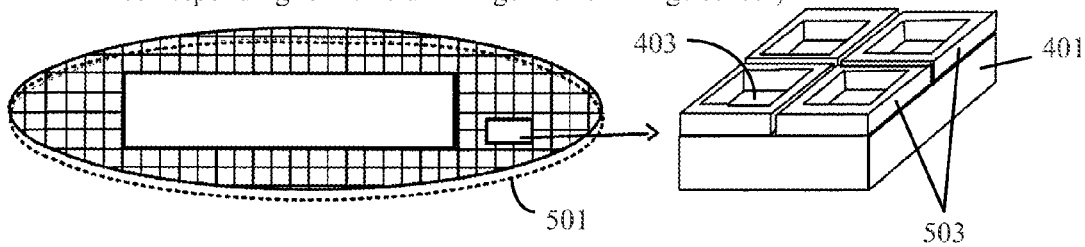

Figure 5

Step 5: Attaching carrier wafer (on the side having replicated lens and cavity)

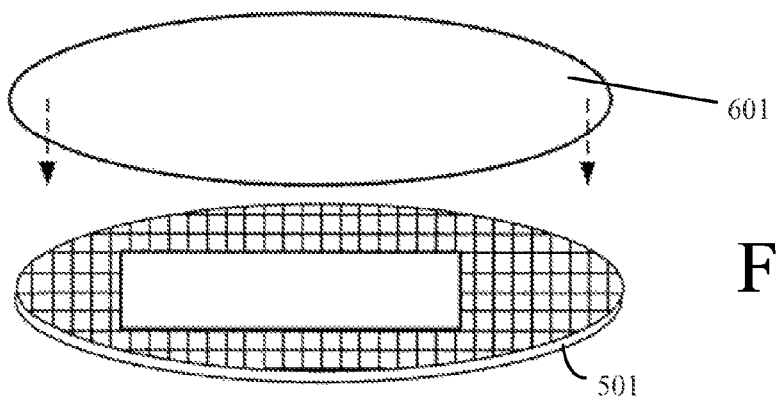

Figure 6

Step 6: Dicing of glass wafer having IR coating + replicated lens + epoxy cavity

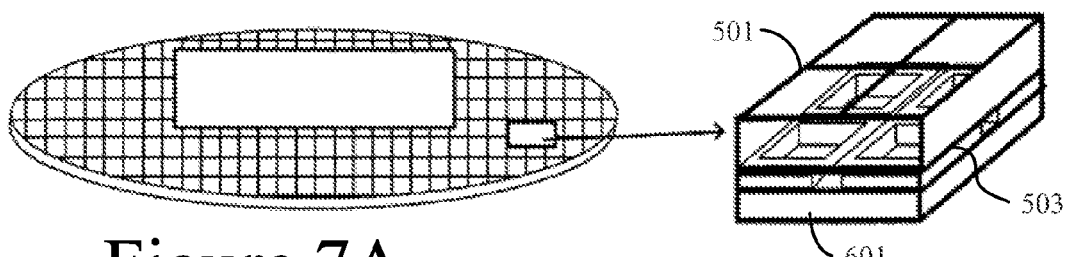

Figure 7A

Close up of diced area after wafer cleaning (unwanted glass from street width remover)

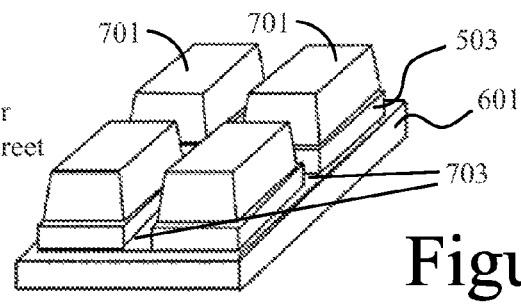

Figure 7B

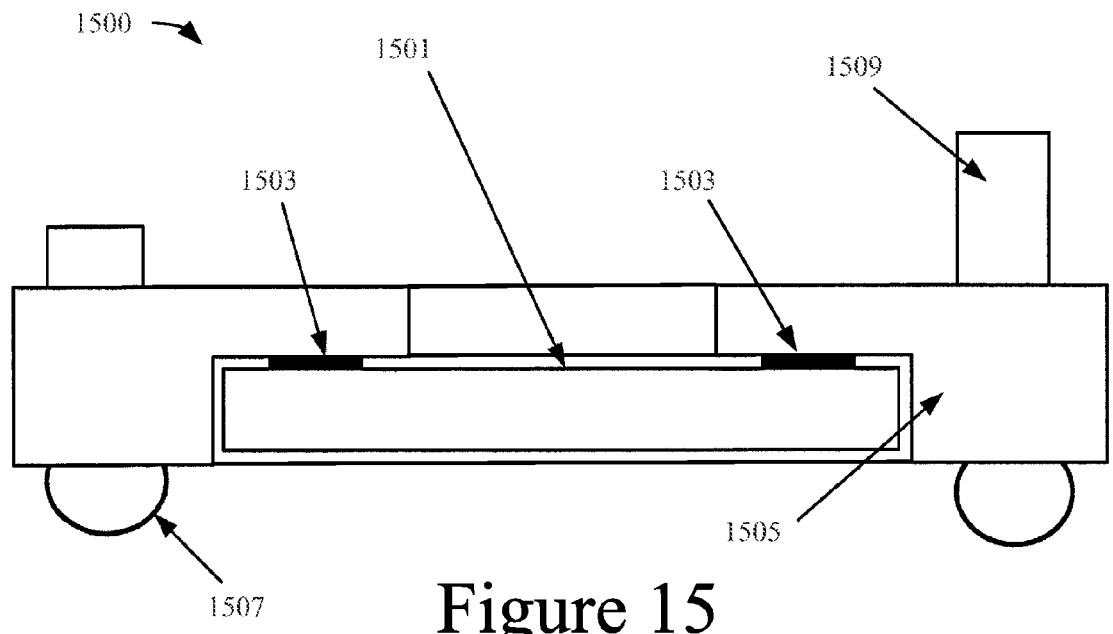
Figure 15
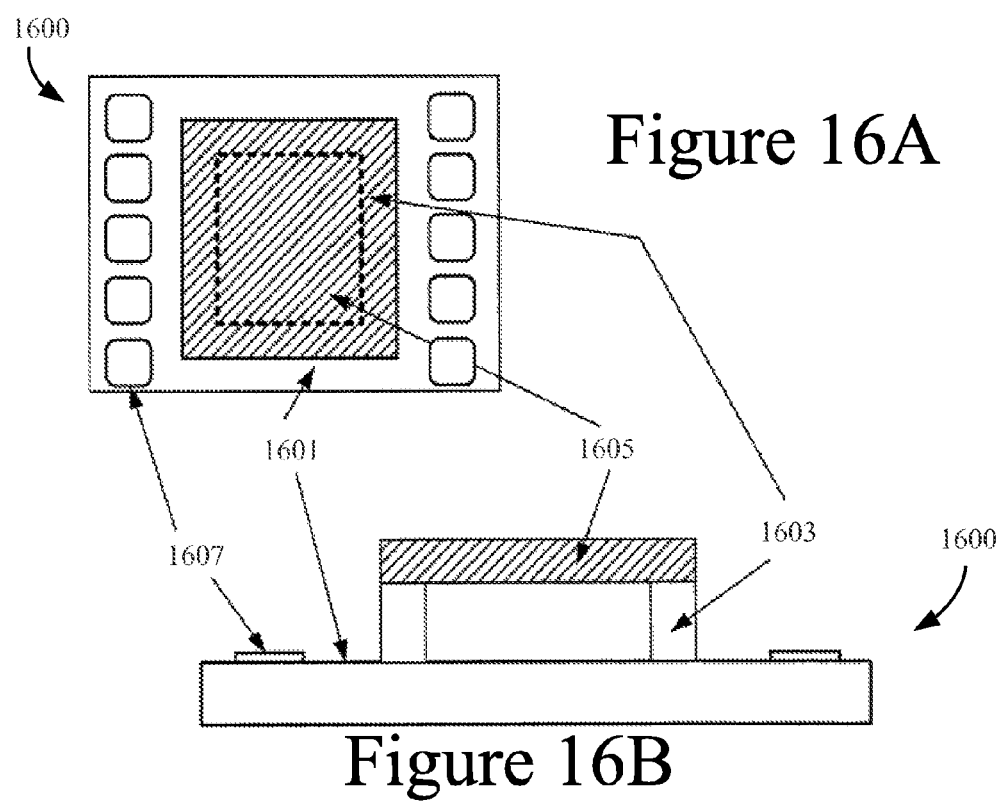
Figure 16A
Figure 16B

Top view

Top view

Top view

Top view

Top view

COMPACT CAMERA MODULES WITH FEATURES FOR REDUCING Z-HEIGHT AND FACILITATING LENS ALIGNMENT AND METHODS FOR MANUFACTURING THE SAME

BACKGROUND

1. Field of the Invention

The invention relates to compact camera modules, particularly including one or more wafer level hybrid optics, a through-hole substrate and/or a flexible or rigid-flexible printed circuit, and/or a flip-chip or wire bond imager, that feature an advantageously thin design.

2. Description of the Related Art

An electronic camera is a device that converts a scene from optical to electronic format. An electronic camera generally includes an optical train of one or more lenses, which focuses light from the scene onto an image sensor. The image sensor converts incident photons into a computer-readable electronic file format. Many image sensors cannot perform this conversion unaided and are instead frequently used in conjunction with further passive and sometimes active components.

U.S. Pat. Nos. 7,858,445 and 7,449,779 describe wire bonded wafer level cavity packages for image sensors. The '445 and '779 patents describe certain embodiments that include a microelectronic device having a chip with an active region at a front surface a plurality of contacts exposed at the front surface outside of the active region. The device further includes a lid overlying the front surface. At least one edge of the lid includes an outer portion. One or more recesses extend laterally inwardly from the outer portion of the lid. Contacts are aligned with the recesses and exposed through them.

U.S. Pat. No. 7,936,062 describes a wafer level chip packaging technique and microelectronic elements packaged by the technique. In an exemplary embodiment, a microelectronic element having a front face and a plurality of peripheral edges bounding the front face has a device region at the front face and a contact region with a plurality of exposed contacts adjacent to at least one of the peripheral edges. The packaged element may include a plurality of support walls overlying the front face of the microelectronic element such that a lid can be mounted to the support walls above the microelectronic element. For example, the lid may have an inner surface confronting the front face. In a particular embodiment, some of the contacts can be exposed beyond edges of the lid.

U.S. Pat. Nos. 7,593,636, 7,768,574, 7,807,508 and 7,244,056 describe examples of structures where the electrical height of a device is nested within the optical height to decrease the physical height. Each of the above patents is incorporated by reference. It is desired to have an advantageously compact camera module.

BRIEF DESCRIPTION OF THE DRAWINGS

FIG. 5 schematically illustrates the bottom view of the wafer of FIG. 4 with several cavities formed in accordance with certain embodiments, e.g., using epoxy, corresponding to the several replicated lens shapes.

FIG. 6 schematically illustrates attaching a carrier wafer on the bottom side of the wafer of FIG. 5, i.e., the side having the replicated lenses and cavities, in accordance with certain embodiments.

FIG. 7A schematically illustrate a top view of the wafer of FIG. 6 with scribe lines shown on the wafer, in accordance with certain embodiments.

FIG. 7B schematically illustrates the top view of the wafer of FIG. 6 with extra material removed along the scribe lines by saw or laser dicing, in accordance with certain embodiments.

FIG. 15 schematically illustrates a flip-chip camera module in accordance with certain embodiments.

FIGS. 16A-16B schematically illustrate plan and section views of a camera module in accordance with certain embodiments.

DETAILED DESCRIPTIONS OF THE EMBODIMENTS

Figure 1:
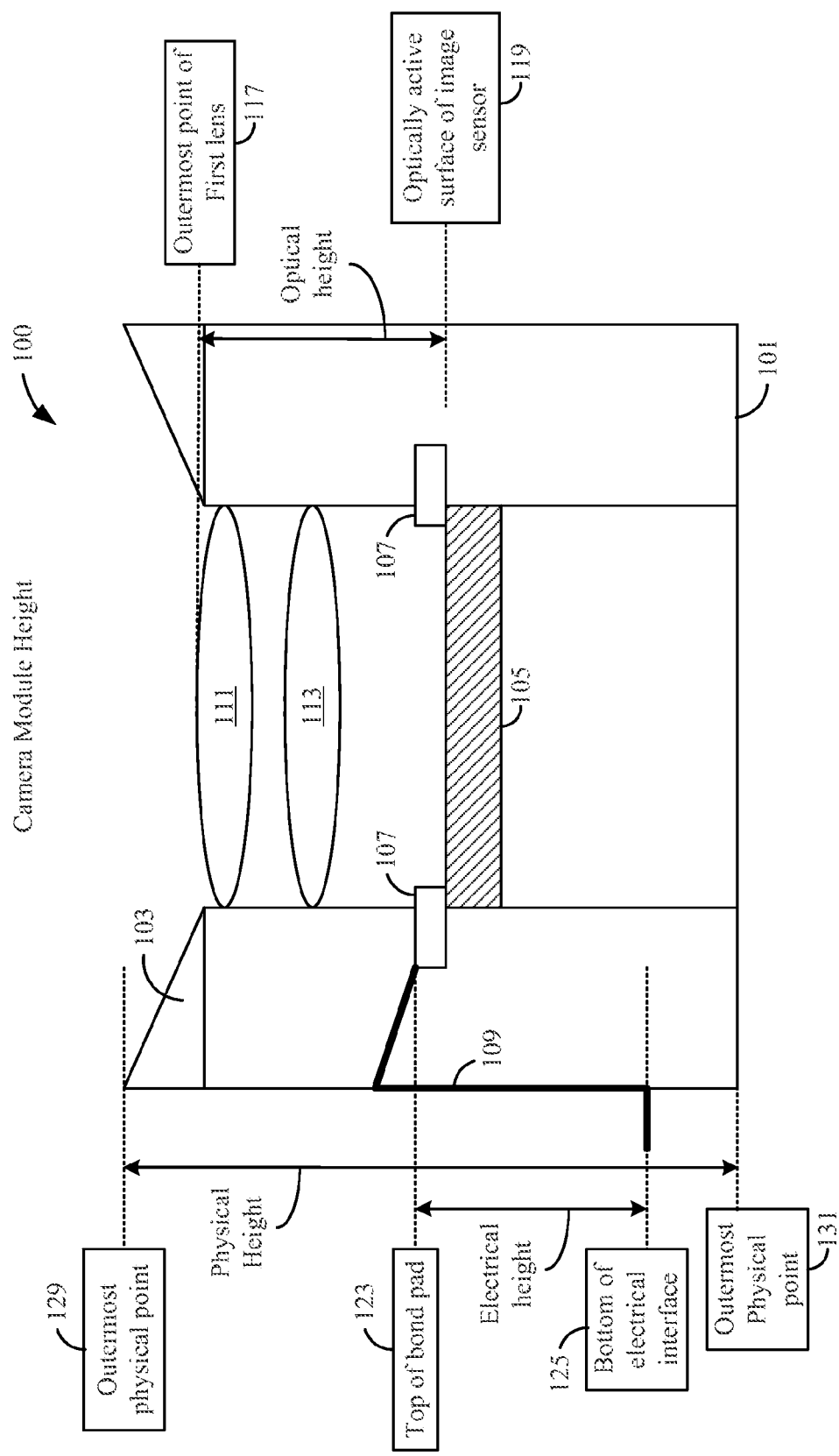
FIG. 1 schematically illustrates a camera module in accordance with certain embodiments.

Compact, miniature and/or solid state camera modules are provided in several embodiments below including embodiments that exhibit a low height and/or a small part count and/or are fabricated with a small number of assembly steps. A low height, or physical "Z" height, is provided in accordance with embodiments that are compatible or may be modified to be compatible with several varieties of modern electronics products, e.g., mobile phones, mobile tablets, laptop computers, portable game controllers, portable digital still and/or video cameras, miniature camera modules for automobiles, surveillance, and/or any a wide variety of further imaging applications, where the current fashion is for extreme thinness or at least available, possible and/or reasonable compactness and/or miniaturization. Another advantageous attribute of camera modules in accordance with certain embodiments is low cost, which is generally attained through combinations of one or more of small parts count, few assembly operations and/or high manufacturing yield.

A solid state camera module is provided in accordance with certain embodiments that includes an over-molded circuit board containing an aperture, an image sensor coupled in flip-chip orientation to the circuit board and including an optically active area that is aligned to the aperture, a lens barrel coupled to the circuit board and physically aligned to the image sensor, and electrical interconnections between the circuit board and the image sensor.

The lens barrel may be configured with physical tilt alignment to the image sensor by touching the lens barrel to the image sensor through the aperture. The electrical interconnections may include one or more μPILR interconnects. One or more μPILR interconnects may have a height that exceeds a thickness of the image sensor. One or more μPILR interconnects may include copper.

Another solid state camera module is provided that includes a flex and/or rigid circuit board containing an aperture, an image sensor coupled in flip-chip orientation to the circuit board and including an optically active area that is aligned to the aperture, and a lens barrel coupled to the circuit board. The lens barrel in this embodiment is physically aligned to the image sensor through the aperture. The camera module also includes electrical interconnections between the circuit board and the image sensor.

The lens barrel may be configured with physical alignment to the image sensor by touching the lens barrel to the image sensor through the aperture. The lens barrel may be configured with physical tilt alignment by the touching. The electrical interconnections may include one or more μPILR interconnects. One or more μPILR interconnects may have a height that exceeds a thickness of the image sensor and/or may include copper. The circuit board may include a flexible printed circuit (FPC) or a rigid-flexible printed circuit (RFPC).

A miniature camera module is provided in accordance with certain embodiments including a substrate, an image sensor coupled to the substrate, an optical train including one or more lenses coupled to the substrate and aligned with the image sensor to define an optical path of the camera module, an aperture defined along the optical path between at least one lens of the optical train and the image sensor, and a printed circuit coupled to the image sensor in such a way that the thickness of the printed circuit does not contribute to a physical Z height in addition to the thickness of the substrate.

The printed circuit may define the aforementioned aperture and/or a different aperture and according to one embodiment, may be electronically-coupled to an active image sensor surface of the image sensor such that the aperture of the printed circuit overlaps an active sensor area along an optical path of the miniature camera. In another embodiment, the printed circuit is electrically coupled to an active image sensor surface of the image sensor at one or both ends such that the printed circuit does not occlude the optical path of the camera module.

The camera module may further include a protective cover over the image sensor that does not contribute to a physical Z height in addition to a thickness of the substrate. The protective cover may serve also as an IR filter. The camera module may also be configured such that the image sensor also does not contribute to a physical Z height in addition to a thickness of the substrate. The protective cover may comprise a closest lens of the optical train to the image sensor. The printed circuit may include a flexible printed circuit (FPC) and/or a rigid-flexible printed circuit (RFPC).

Another miniature camera module is provided that includes a substrate, an image sensor coupled to the substrate, an optical train including one or more lenses coupled to the substrate and aligned with the image sensor to define an optical path of the camera module, an aperture defined along the optical path between at least one lens of the optical train and the image sensor, and a printed circuit coupled to the image sensor. At least one lens, of the optical train, that is closest to the image sensor is formed, in this embodiment, from a protective cover that is disposed over the image sensor, such that a physical Z height is reduced compared with a camera having separate optical elements for protective cover and closest lens to the image sensor.

The at least one lens formed from the protective cover may include an infrared (IR) filter. The image sensor and protective cover may be coupled together at wafer stage prior to dicing. The miniature camera module may be configured such that the printed circuit and/or the image sensor also do not contribute to physical Z height in addition to a thickness of the substrate. The printed circuit may be or may include a fold-over flexible printed circuit.

Another miniature camera module is provided that includes a substrate defining a cavity, an image sensor coupled to the substrate, an optical train including one or more lenses coupled to the substrate and aligned with the image sensor to define an optical path of the camera module, an aperture defined along the optical path between at least one lens of the optical train and the image sensor, a printed circuit coupled to the image sensor, and a protective cover over an active sensor area of the image sensor and disposed within said cavity of said substrate such that at least a significant portion of a thickness of the protective cover does not contribute to a physical Z height in addition to a thickness of the substrate.

The entire thickness of the protective cover may be disposed within the cavity, thereby not contributing to the physical Z height in addition to the thickness of the substrate. The protective cover may include the closest optic to the image sensor of the optical train. The protective cover may also serve as an IR filter. The miniature camera module may be configured such that the printed circuit also does not contribute to the physical Z height of the camera module in addition to the thickness of the substrate. The printed circuit may be or may include a fold-over flexible printed circuit.

Another miniature camera module is provided that includes a substrate defining a cavity, an image sensor coupled to the substrate and disposed within the cavity such that at least a significant portion of a thickness of the image sensor does not contribute to a physical Z height in addition to a thickness of the substrate, an optical train including one or more lenses coupled to the substrate and aligned with the image sensor to define an optical path of the camera module, an aperture defined along the optical path between at least one lens of the optical train and the image sensor, a printed circuit coupled to the image sensor, and a protective cover over an active sensor area of the image sensor.

An entire thickness of the image sensor may be disposed within the cavity and not contribute to the physical Z height in addition to the thickness of the substrate. All or a significant portion of the protective cover may also disposed within the cavity and thereby not contribute to the physical Z height in addition to the thickness of the substrate. The miniature camera module may be configured such that a thickness of the printed circuit does not contribute to physical Z height in addition to the thickness of the substrate. The protective cover may also serve as an infrared (IR) filter.

Another miniature camera module is provided that includes a substrate, an image sensor coupled to the substrate, an optical train including one or more lenses coupled to the substrate and aligned with the image sensor to define an optical path of the camera module, an aperture defined along the optical path between at least one lens of the optical train and the image sensor, a printed circuit coupled to the image sensor for carrying electronic signals corresponding to image data from the image sensor, and a protective cover over an active sensor area of the image sensor. The miniature camera module may be configured in various embodiments such that a thickness of one or more or all of (i) the image sensor, (ii) the protective cover, (iii) the printed circuit, and (iv) a lens of the optical train that is closest to the image sensor do NOT contribute to a physical Z height in addition to a thickness of the substrate. In some embodiments, the lens that is closest to the image sensor is formed from the protective cover. In some embodiments, the closest lens is formed from the protective cover at wafer stage before dicing.

Another miniature camera module is provided including a substrate defining a cavity including an aperture, an image sensor coupled to the substrate at least partially within the cavity and including an active sensor area overlapping the aperture, a transparent protective cover coupled to the image sensor over the active sensor area, an optical housing coupled to the substrate containing therein a train of one or more imaging optics overlapping the aperture and forming an optical path from a first optic of the train through the aperture and transparent protective cover to the active sensor area, and a flexible printed circuit coupled to the image sensor to carry electrical signals corresponding to image data from the image sensor. The cover may include a closest optic to the image sensor of the train of one or more imaging optics. The printed circuit may be or may include a fold-over flexible printed circuit.

A method of forming a miniature camera module component is also provided. Multiple replicated lens shapes are formed on a protective cover wafer. Material is deposited or otherwise provided onto the protective cover wafer to form multiple cavities, or multiple cavities may be provided by etching or otherwise, with respective multiple replicated lens shapes disposed therein. A carrier wafer is coupled to the protective cover wafer on the side with the deposited material. The protective cover wafer is diced. An intermediate wafer is coupled to the protective cover wafer on the side opposite the deposited material. The carrier wafer is removed. An image sensor wafer is coupled to the protective cover wafer on the side with the deposited material. The intermediate wafer is removed.

The image sensor wafer may be diced to form multiple singulated sensors with replicated lens shape protective covers. A singulated sensor may be coupled to a printed circuit or a rigid substrate or both. The depositing or otherwise providing material to form the multiple cavities may include masking active image areas of the multiple replicated lens shapes. The depositing or otherwise providing material to form the multiple cavities may include depositing epoxy onto the protective cover wafer other than over the active image areas protected by the masking.

The dicing may include wafer cleaning. The wafer cleaning may include removing protective cover material along dicing lines.

The protective cover wafer may include an IR filter. The IR filter may include one or both of blue glass material or an IR coating.

Camera Module

Several embodiments of low height miniature camera modules are provided and described herein. Various metrics are advantageously improved upon alone and in various combinations. One of these metrics involves the optical Z height, a second metric involves electrical Z height and a third involves the physical Z height. The optical Z height can be referred to as a distance from an optically active surface of an image sensor to an outermost point of a first lens. This may be referred to also as the TTL (total track length). The electrical Z height can be referred to as a distance from a bond pad on the image sensor to an outermost point of the electrical interface. The outermost points of the optics and the electronics are in opposite directions in certain embodiments, although in other embodiments the outermost electronics are advantageously significantly nearer to the outermost optics.

The physical Z height can be referred to as the longest Z dimension, including passive components and/or structural members. The physical Z height can be referred to as a distance along a direction of an optical path of a camera module between a furthest from an active surface of an image sensor of (i) a first optical surface of an optical train including one or more imaging optics, and (ii) a far end of a housing, e.g., a lens barrel, that contains the optical train, and (iii) an optional shutter or other aperture, through the active surface of the image sensor to a back surface of the camera module device that comprises a furthest from the active surface of the image sensor of (iv) a backside of the image sensor, (v) a surface of a support substrate to which the image sensor is coupled, and (vi) a flexible, rigid or flexible-rigid printed circuit, or other wired or wireless signal transmission mechanism that is electronically-coupled or otherwise signal-coupled to the image sensor for one or more of carrying, displaying, editing or storing signals including and/or corresponding to image data captured by the image sensor.

The optical and electrical Z heights serve in some embodiments to dictate the physical Z height, e.g., such that there is no surplus material. Other embodiments differ such as the example of FIG. 1 that is described below.

Each of the optical, electrical and optical Z height is measured along the optical axis of the camera, unless otherwise indicated herein or as may be understood based on unique features of certain embodiments, e.g., that may utilize one or more folding mirrors or beamsplitters that change the direction of the optical path away from parallel to the physical Z direction, and/or one or more non-linear, asymmetric, aspheric, anisotropic, multi-focal, diffractive optics such as gratings, prisms, prismatic lenses, etalons and/or other refractive or diffractive lenses or other optics, and/or flip-chip architectures, or otherwise. Several embodiments of camera modules are provided that exhibit advantageously compact features including a short physical Z height.

Referring now to FIG. 1, a camera module 100 in accordance with a certain embodiment is schematically illustrated by way of example physical, electronic and optical architectures. Other camera module embodiments and embodiments of features and components of camera modules that may be included with alternative embodiments are described at U.S. Pat. Nos. 7,224,056, 7,683,468, 7,936,062, 7,935,568, 7,927,070, 7,858,445, 7,807,508, 7,569,424, 7,449,779, 7,443,597, 7,768,574, 7,593,636, 7,566,853, 8,005,268, 8,014,662, 8,090,252, 8,004,780, 8,119,516, 7,920,163, 7,747,155, 7,368,695, 7,095,054, 6,888,168, 6,583,444, and 5,882,221, and US published patent applications nos. 2012/0063761, 2011/0317013, 2011/0255182, 2011/0274423, 2010/0053407, 2009/0212381, 2009/0023249, 2008/0296,717, 2008/0099907, 2008/0099900, 2008/0029879, 2007/0190747, 2007/0190691, 2007/0145564, 2007/0138644, 2007/0096312, 2007/0096311, 2007/0096295, 2005/0095835, 2005/0087861, 2005/0085016, 2005/0082654, 2005/0082653, 2005/0067688, and U.S. patent application No. 61/609,293, and PCT application no. PCT/US2012/24018, which are all hereby incorporated by reference.

The example camera module 100 of FIG. 1 includes a module base 101, a baffle 103, an image sensor 105, at least one bond pad 107, at least one electrical interface 109 and first and second lenses 111 and 113, respectively. An optical Z height of the example camera module 100 of FIG. 1 is illustrated as the distance from the outermost point 117 of the first lens 111 to the level of the optically active surface 119 of the image sensor 105. The electrical Z height of the example camera module 100 of FIG. 1 is illustrated as the distance from the top 123 of a bond pad 107 to a bottom 125 of electrical interface 109. The physical Z height of the camera module 100 of FIG. 1 is illustrated as the distance from the outermost physical point 129, in this case, the top end of the baffle 103, to the outermost physical point 131 on the opposite end of the camera module 100 in a direction of the optical path, which in this case is the furthest bottom end of the module base 101 from the image sensor 105. In this example, the physical height overlaps entirely both the electrical height and the optical height, and includes the outermost extent of the baffle 103 beyond both the top of the bond pad 107 and the outermost point 117 of the first lens 111, and also includes the outermost extent of the module base 101 on the opposite end of the optical path beyond both the level of the optically active surface 119 of the image sensor 105 and the bottom 125 of the electrical interface 109.

Even in embodiments where the optical path bends or folds rather than being everywhere parallel with the Z direction, the optical Z height is still referred to as the distance from the outermost physical point of any lens and the image plane. For example, in certain embodiments, the optical train may be rotated by 90° and a folding mirror may redirect the light to the image sensor. In an alternative, a reflecting mirror may be used to return the light back through one or more optics such as an aperture or IR filter or polarizer or otherwise to be then redirected by the folding mirror to the image sensor. In embodiments where the optical train is longer than it is wide, the optical and physical Z height can be reduced by rotating the optical train, contained in certain embodiments within a lens barrel, "on its side," and including a folding mirror to bend the optical path towards the image sensor. The optical train may be rotated by another angle than 90° to fit a camera module space, e.g., that may be cramped or oddly shaped, of a larger camera-enabled device. In other embodiments, it may be the sensor that is rotated and, e.g., disposed within a cavity defined within a side wall of a module base, substrate or lens barrel or other housing component. One or more mirrors can be used to redirect the light to the image sensor whatever the relative orientation of the optical train and image sensor in these alternative embodiments.

Camera Module with Protective Cover

In certain embodiments, an optical surface can be added to the image sensor as a singulated component. This optical surface can serve as a cover, made of transparent glass or polymer, to prevent dust or other contaminant from the reaching the active surface of the sensor, while permitting visible light to get through to the sensor. The optical surface can also serve as an infrared (IR) filter, particularly for a silicon sensor. An IR absorbing material may be used for the cover or an IR coating may be applied to the glass or polymeric or other optically transparent protective cover. The optical surface can also be formed to provide optical power such as in the shape of a replicated lens. A process for forming the singulated component at the wafer stage before dicing is provided hereinbelow.

Referring to FIGS. 2A-14, a process for making an example camera module component is described. The component includes an active image sensor protected against contamination using wafer level hybrid optics. This approach has another advantage in that an overall physical Z height of the camera module may be reduced by incorporating such hybrid optics with the camera module component.

The active image area on the image sensor is protected in accordance with certain embodiments at the wafer stage before dicing or singulation of the image sensor wafer into discrete dies. This protection of the active image area is achieved in certain embodiments by attaching a glass wafer, such as a blue glass or IR coated glass, or other material such as a polymer or other material that is transparent to visible light and absorbs or otherwise blocks IR light. Further improved functionality of this glass protection is achieved by adding a wafer level optics element. An image sensor is thereby provided with an image area protected against particles or other contamination and advantageously also including one or more optical elements. Module and/or physical Z height is reduced in certain embodiments permitting lower back focal length (BFL) optical design heights. In addition, better protection against contamination of the image area is provided, which is particularly advantageous considering that pixel sizes are now contemplated to shrink from 2.2 um→1.75 um→1.4 um→1.1 um and beyond over the next several years.

Process Flow for Creating Wafer Level IR Filter+One Lens Element

Figure 2A:
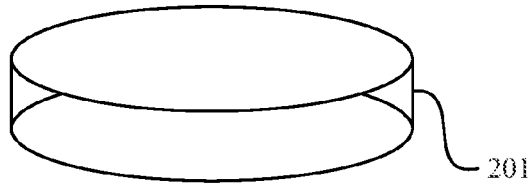
FIGS. 2A-2B schematically illustrates a plain glass wafer or blue glass wafer and/or a process involving providing and/or starting with a clean glass wafer or blue glass wafer, in accordance with certain embodiments.
Figure 2B:
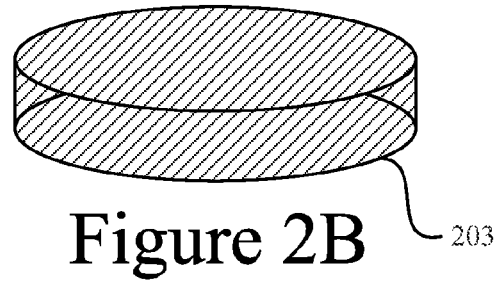

Each of FIGS. 2A-2B schematically illustrates an example product of a step in a process that includes respectively providing a glass wafer 201 or a blue glass wafer 203. That is, the process involves providing and/or starting with a clean glass wafer 201 such as that illustrated at FIG. 2A, or a blue glass wafer 203 such as illustrated at FIG. 2B. FIG. 2B could include a processed or unprocessed wafer of a material, composition, compound or configuration, that substantially filters infrared light that may be incident upon it, everywhere or specifically in an area of the wafer that will have IR light incident upon it and is along the optical path of a camera module such that if not blocked it would impinge upon an active image sensor area.

Figure 3:
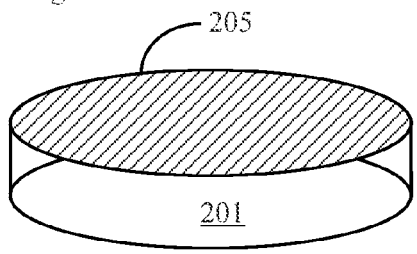
FIG. 3 schematically illustrates a glass wafer with an IR coating, in accordance with certain embodiments.

FIG. 3 schematically illustrates an example product of a step in a process involving applying an IR coating 205 to the glass wafer 201 of FIG. 2A. Alternatively, this step can be accomplished by providing the blue glass (or alternative) wafer 203 of FIG. 2B, which provides IR filter functionality without an additional IR coating applied. So, the step illustrated at FIG. 3 is not used in most embodiments with the blue glass (or alternative) wafer 203 of FIG. 2B. The glass wafer 201 of FIG. 2A is coated on one side in most embodiments, but may be coated on both sides or if the glass wafer is composed of two wafers coupled together, then the IR coating 205 can be on an interior surface.

Figure 4A:
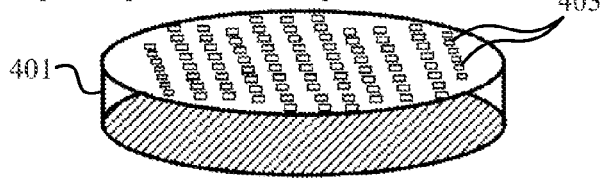
FIGS. 4A-4C schematically illustrates a bottom view of the wafer of FIG. 3 including several replicated lens shapes.
Figure 4B:
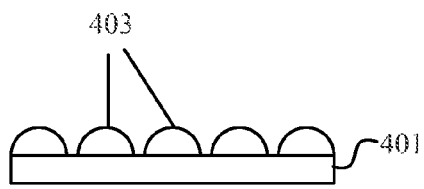
Figure 4C:
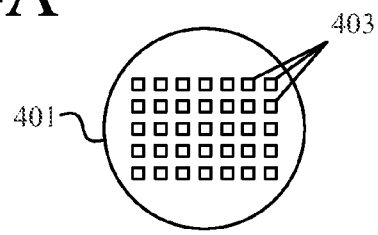

FIGS. 4A, 4B and 4C schematically illustrate a perspective view, a section view and a plan view, respectively, of an example product of a step in a process including processing the wafer 201 of FIG. 3 on the opposite side as the IR coating 205 to produce the wafer 401. The wafer 401 of FIGS. 4A, 4B and 4C includes multiple replicated lens shapes 403 formed on the "bottom" side (shown inverted from FIG. 3 in FIGS. 4A-4C). For the blue glass wafer 203 of FIG. 2B, either side can be used to replicate the lens shapes 403, while for the IR coated clean glass wafer 201 of FIG. 2A, the side opposite the IR coating 205 is used to form the replicated lens shapes 403. The forming of the lens shapes 403 can utilize dry etching, wet etching, plasma etching, reactive ion etching, replicated lens layer coupling or adhesion, optical epoxy, photolithography using photoresist or UV curable epoxy and involving melting the material to form arrays of multiple lenses, curing molten glass or polymer, molding or embossing from a master lens array, convective assembly of colloidal particles from suspension, master lens array replication involving generation of electroform, or wafer-level or binary or liquid optics or a combination of two or more of these or use of another step or process or use of another material or component as may be understood by those skilled in the art of replicating lens arrays, microlens arrays or lenslet arrays. The IR coated wafer of FIG. 3, or the blue glass wafer of FIG. 2B, or alternative wafer with IR filtering feature, with replicated lens shapes 403 is then further processed in accordance with FIGS. 5-12.

FIG. 5 schematically illustrates the product 501 of a step in a process that includes forming cavities 503 on the wafer 401 within which the replicated lens shapes 403 (e.g., microlenses, etc.) of FIGS. 4A-4C are disposed. In certain embodiments, the microlens diameter is larger than the active area (will be) of an image sensor of a camera module within which this product is contemplated to be a part, and so the dimensions of a cavity 503 can be smaller than the diameter of a microlens, and the cavity dimension may also be larger in some embodiments or approximately the same dimension in other embodiments as the active area of the image sensor of the camera module. In other embodiments, the diameter of the microlens array is similar to the dimension of the active area of the image sensor of the sensor array, while special optics or image processing may be used in these embodiments to reduce or prevent effects of distortion otherwise produced at the peripheral areas of the microlenses. In certain embodiments, epoxy is deposited after masking the active image area corresponding to the actual image area on the image sensor. In other embodiments, the cavities 503 are formed by etching. In some embodiments, the cavities 503 are formed during the same process as the replication of the microlenses. In certain embodiments, the walls of the cavity are formed from the same material as the microlenses, and in one embodiment the walls of the cavity and the microlenses are formed from the same wafer. The cavities 503 that are formed with replicated lens shapes 403 disposed therein are in certain embodiments larger than the image areas on the image sensor.

FIG. 6 schematically illustrates an example product of a step in a process that includes attaching a carrier wafer 601 on the side of the product 501 of FIG. 5 having the replicated lenses 403 within the formed cavities 503. The wafer 501 with IR coating and replicated lens shapes 403 within formed cavity walls 503 is bonded to the carrier wafer 601 in this step, e.g., using an adhesive or a mechanical clamp.

FIG. 7A schematically illustrates an example product of a step in a process that includes dicing of the glass wafer having the IR coating of FIG. 6, or the blue glass or alternative IR filtering wafer, with replicated lenses 403 and formed cavities 503. Extra wafer material may be removed by saw or laser dicing. FIG. 7B schematically illustrates a close up of a diced area after wafer cleaning, e.g., showing the glass die 701 and with unwanted glass removed from streets 703 created by the dicing.

Figure 8:
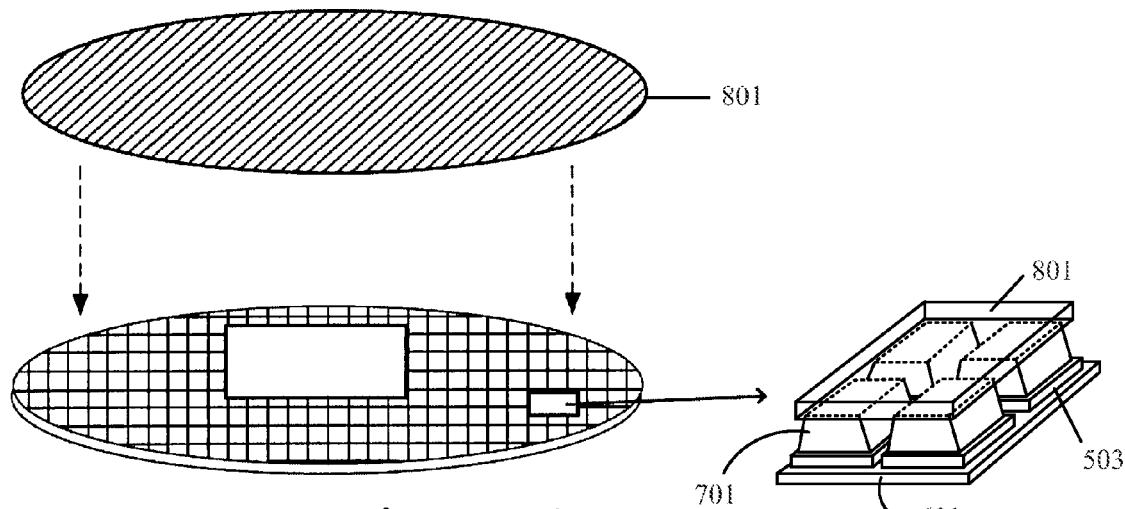
FIG. 8 schematically illustrates bonding of an intermediate wafer to the top side of the wafer, in accordance with certain embodiments.

FIG. 8 schematically illustrates an example product of a step in a process that includes bonding the product of FIG. 7B to an intermediate wafer 801, while the replicated lens and formed cavity side of the wafer is still attached to the carrier wafer 601. The assembly of the carrier wafer 601 with the diced glass (or other suitable transparent material) wafer having IR coating (unless it is blue glass) with replicated lens shapes disposed within cavity walls 503 is bonded to the intermediate glass wafer 801 still as a full wafer.

Figure 9:
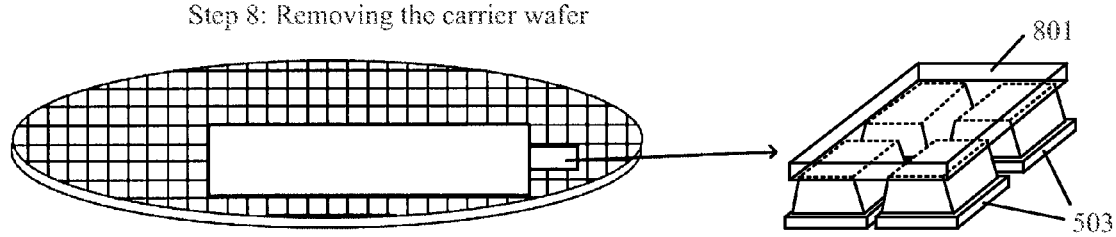
FIG. 9 schematically illustrates removal of the carrier wafer from the bottom side of the wafer, in accordance with certain embodiments.

FIG. 9 schematically illustrates an example product of a step in a process that involves removing the carrier wafer 601 from the product of FIG. 8.

Figure 10:
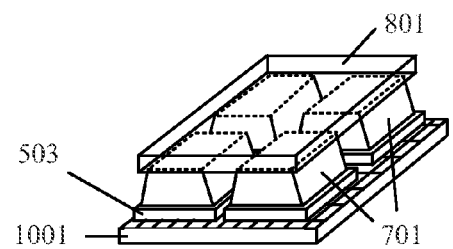
FIG. 10 schematically illustrates bonding of an image sensor wafer to the bottom side of the wafer, in accordance with certain embodiments.

FIG. 10 schematically illustrates an example product of a step in a process that includes bonding the product of FIG. 9 to an image sensor wafer 1001. This assembly of an image sensor wafer 1001 and the diced glass 701 still bonded to the intermediate wafer 801 is still performed at the wafer level.

Figure 11:
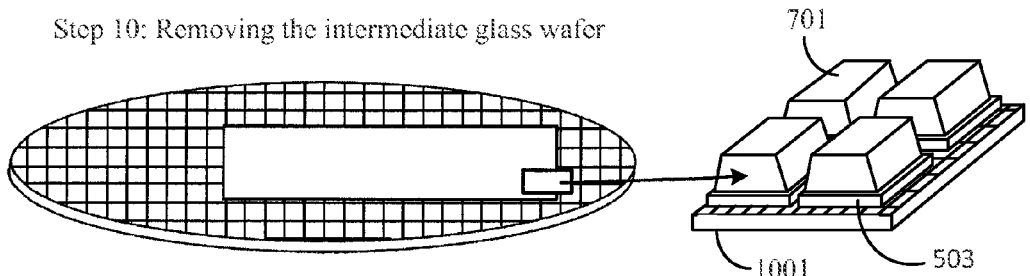
FIG. 11 schematically illustrates removing of the Intermediate wafer, in accordance with certain embodiments.

FIG. 11 schematically illustrates an example product of a step in a process that involves removing the intermediate wafer 801 from the image sensor assembly that includes the image sensor wafer 1001 with independent glass die 701 thereon, each including IR filter coating or IR filter material in accordance with various embodiments particularly when a silicon sensor is used, and a replicated lens shape 403 disposed within a cavity 503 that is configured to have transparent communication with the an active area of sensor material.

Figure 12A:
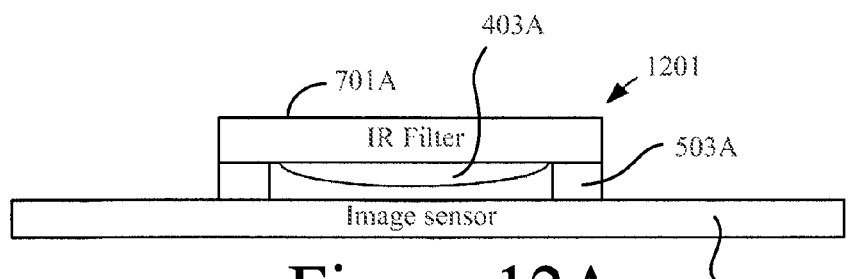
FIG. 12A schematically illustrates a singulated image sensor dies after dicing of the image sensor wafer of FIGS. 10-11, in accordance with certain embodiments.
Figure 12B:
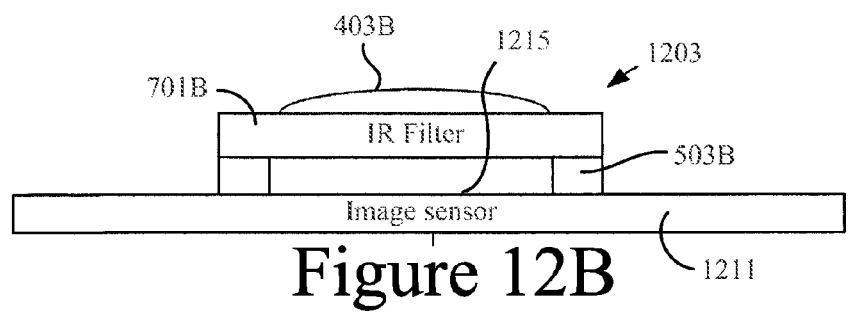
FIG. 12B schematically illustrates another singulated image sensor with IR filter and replicated lens shape of opposite side as in FIG. 12A, in accordance with another embodiment.
Figure 12C:
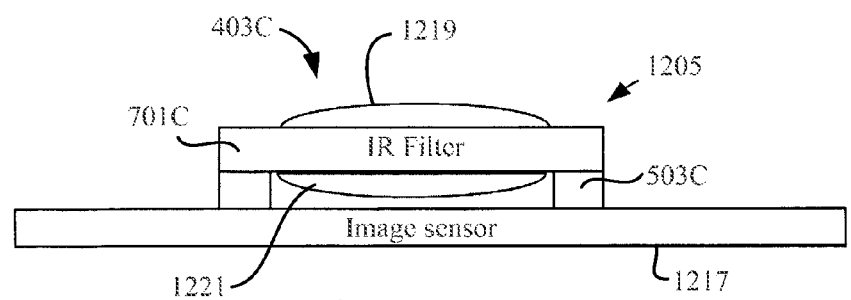
FIG. 12C schematically illustrates another singulated image sensor with IR filter and replicated lens shape on both sides, in accordance with another embodiment.

FIGS. 12A, 12B and 12C schematically illustrate three different embodiments of example products of a step in a process that involves formation of singulated image sensor dies after the image sensor wafer 1001 of FIG. 11 is diced. FIGS. 12A, 12B, and 12C show exemplary image sensor assemblies 1201, 1203, and 1205, respectively. The image sensor assembly 1201 of FIG. 12A has an image sensor die 1207, a cavity wall 503A and an IR filtering glass die 701A that includes the replicated lens shape 403A as a convex face adjacent the image sensor die 1207. The image sensor assembly 1203 of FIG. 12B has an image sensor die 1211, a cavity wall 503B and an IR filtering glass die 701B that includes the replicated lens shape 403B as a convex face in the other direction from the image sensor 1211 toward the object or scene that is being imaged. Either of the embodiments of FIG. 12A or 12B provides optical power to focus light onto the active image plane of the image sensor (e.g., the image plane 1215 of image sensor 1211 in the case of FIG. 12B). The image sensor assembly 1205 of FIG. 12C has an image sensor die 1217, a cavity wall 503C, and an IR filtering glass die 701C that includes replicated lens shape 403C. FIG. 12C illustrates an embodiment wherein both surfaces 1219 and 1221 of the replicated lens shape 403C are shaped to contribute optical power to the image sensor 1217. Advantageously, any of the camera module components, or in this example embodiment singulated image sensor dies, of FIGS. 12A-12C provides protection against particles and/or other contaminants hence improving overall camera yields, and has at least one element of the optical system or optical train of an overall camera module integrated at wafer level that helps in achieving reduced physical Z height for the module.

Figure 13:
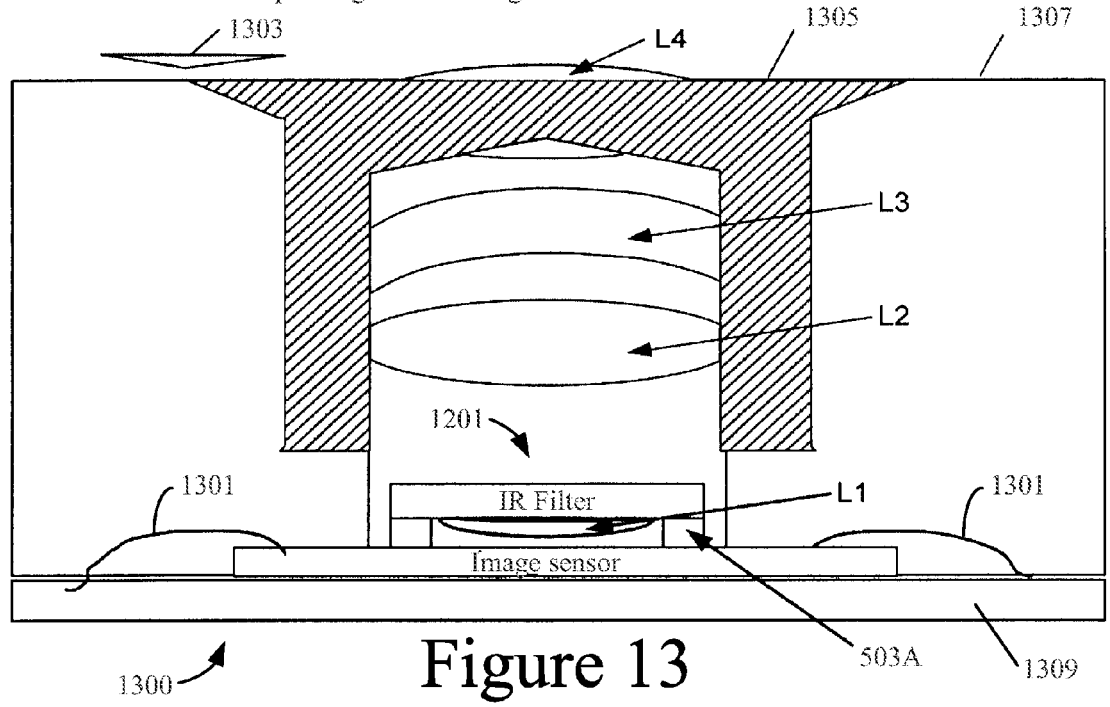
FIG. 13 schematically illustrates a camera module with wire bond leads in accordance with certain embodiments.

FIG. 13 schematically illustrates an example camera module 1300 that includes a plurality of wire bonds 1301 coupled to the image sensor assembly 1201 illustrated schematically at FIG. 12A. Camera module 1300 also includes a well for UV 1303, a lens barrel 1305, a housing 1307, and a substrate 1309. Image sensor assemblies having IR filter capability, such as assembly 1201, and replicated lens elements supported by epoxy or other material cavity walls 503A can be used in fixed focus cameras without additional lens elements in certain embodiments. In auto focus and zoom camera modules in accordance with various embodiments, actuators like (voice coil motor) VCM, (microelectromechanical system) MEMS, piezo (pressure-activated) actuators and/or stepper motors coupled with movable lenses and/or other optics and/or processor-based components such as distortion correction components, chromatic aberration correction components, luminance, chrominance, and/or luminance or chrominance contrast enhancement components, blur correction components, and/or extended depth of field (EDOF) and/or extended or high dynamic range (EDR or HDR) components can be used.

Figure 14:
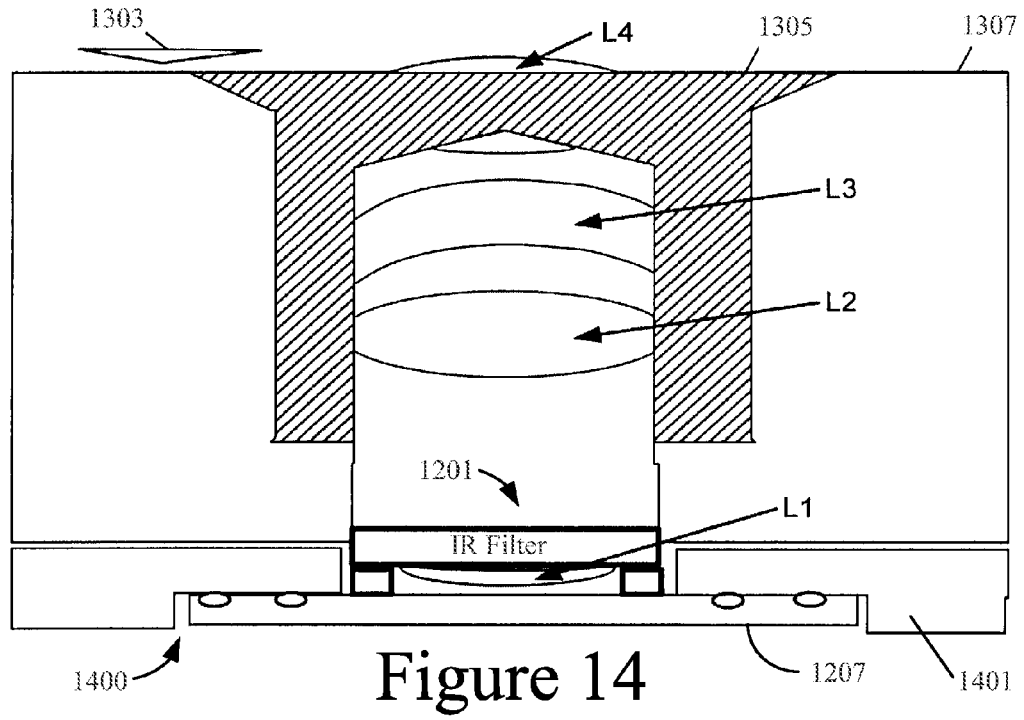
FIG. 14 schematically illustrates a camera module with flip-chip design in accordance with certain embodiments.

FIG. 14 schematically illustrates an example camera module 1400 that includes an image sensor assembly (e.g., image sensor assembly 1201 in FIG. 12A) that is flip-chip mounted to a substrate 1401 that is, in turn, mounted to the housing 1307. The example camera module 1400 illustrated schematically at FIG. 14 may use thermal compression or a thermosonic process.

Camera Module with Through-Hole Substrate

Certain embodiments to be described hereinbelow feature advantageously small physical Z heights particularly by nesting a significant proportion of an electrical Z height within an optical Z height. Reference is now made to embodiments illustrated at FIGS. 15-26.

Various embodiments include structures for camera modules that use an imager in flip-chip orientation and a through-hole substrate for interconnects. Camera modules with imagers in flip-chip orientation and through-hole substrates advantageously make electrical connection to flexible printed circuits or rigid-flexible printed circuits or other circuitry and to external interconnects while either not adding to the physical Z height in addition to a substrate to which the image sensor is attached or embedded within, or in addition to contributions to the physical Z height of the optical Z height, or both, or at least significantly reducing contributions of the electrical Z height to the physical Z height. The following embodiments feature camera modules having an advantageous electrical connection between image sensor die and the module interface and/or that have been assembled in an advantageous process.

For convenience of handling, integration, robustness and cost, electronic camera modules in accordance with certain embodiments include multiple components that are integrated as a unitary component. Various embodiments of camera modules are described herein. In some embodiments, a ceramic is used as a substrate. The ceramic may be a rigid, stable material that can be manufactured to a desired and/or selected degree of flatness and can carry a wiring trace. On the wiring trace can be mounted certain active and/or passive components. The image sensor may be connected to the wiring trace in certain embodiments by wire bonds, particularly if mounted on top of the substrate or by flip-chip interconnects mounted underneath the substrate. An example of a camera module 1500 with an image sensor mounted and connected with flip-chip interconnects is illustrated schematically in section view in FIG. 15. The camera module 1500 of FIG. 15 advantageously has an image sensor 1501 that is coupled by a plurality of bond pads 1503 within a cavity defined within the ceramic substrate 1505 so that the thickness of the image sensor 1501 does not add to the camera module height along with the full thickness of the substrate 1505. The electrical interface to the camera module 1500 of FIG. 15 may include a wiring trace that can be made by a variety of methods including soldered joints, a ball grid array 1507, and copper pillars or micro-pillar (µPILR). Not shown in FIG. 15, are optical components of the camera module 1500 such as one or more lenses of the optical train.

Various embodiments are described that provide high performance at reasonable cost, while modifications are possible that provide even further reductions in cost. The reductions in cost can be provided by combinations of reducing component costs and assembly costs, and improving process yield. In certain embodiments, more expensive parts are selected that actually result in lower total costs through reducing the number and/or complexity of assembly operations.

Camera modules in accordance with several further embodiments are described below. Several examples of camera modules that can be efficiently manufactured are illustrated in the text that follows with reference to accompanying drawings. Certain optical parts of the camera module such as one or more lenses and/or apertures, a shutter, a housing or barrel for holding certain optics, a lens or a lens barrel, or other optic such as a mirror, light source, secondary sensor, accelerometer, gyroscope, power connection, or housing alignment and/or coupling pins or recesses or other such structures are not illustrated in FIGS. 15-26 even though one or more or several or all may be included in a digital still and/or video camera or camera module or camera phone or tablet or laptop computer or other electronic camera-enabled device, and so these are generally not referred to below nor shown in the figures. The starting point for assembly of a camera module or camera module component may be thought of as the image sensor. In certain embodiments, the optically active area of the imager is protected by a cavity, closed with a cover glass, e.g., such as that illustrated at FIGS. 12A-14.

Another example structure is illustrated in plan and section view in FIGS. 16A and 16B, respectively. The camera module or camera module component 1600 of FIGS. 16A-16B includes an image sensor die 1601, cavity wall 1603, cover glass 1605, and several bond pads 1607 for making electrical connection between the image sensor die 1601 and external electronics such as an image processor, image data storage or an image data transmission components.

Figure 17:
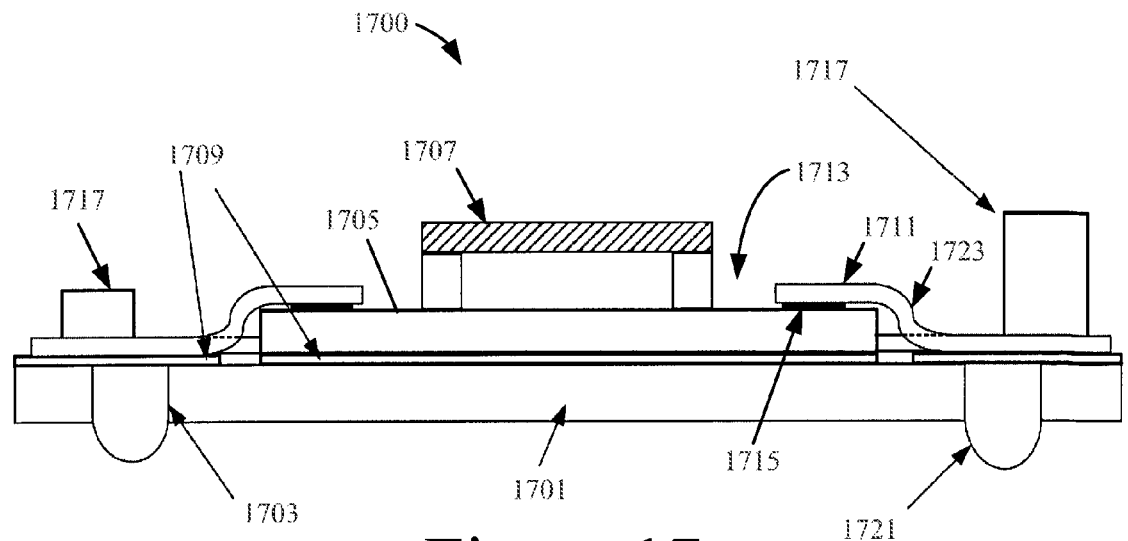
FIG. 17 schematically illustrates a section view of another camera module with solder interconnects in accordance with certain embodiments.
Figure 18:
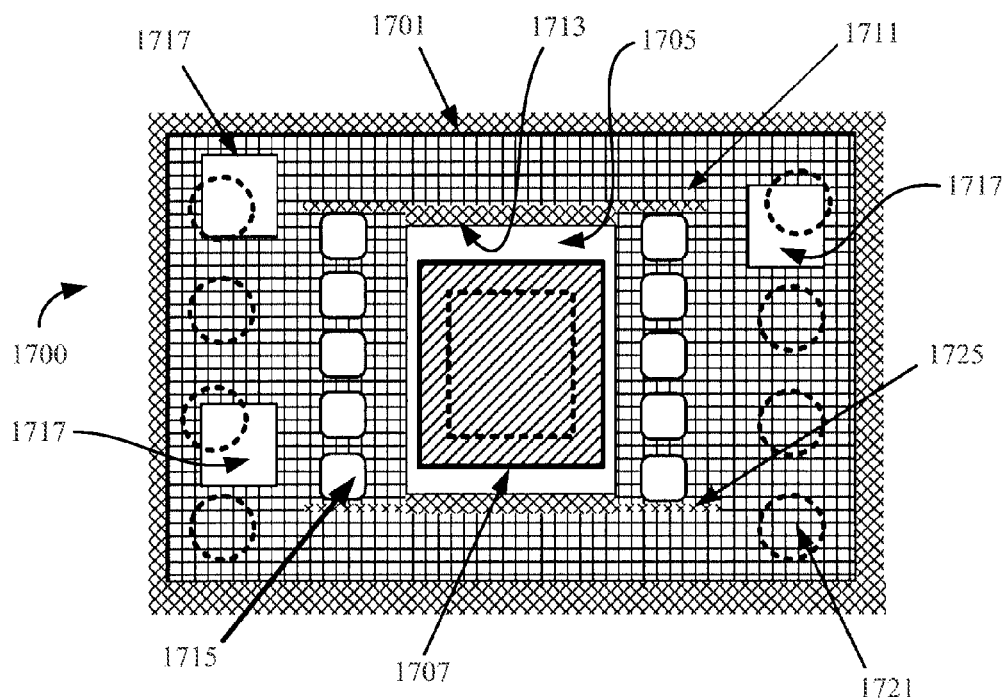
FIG. 18 schematically illustrates a plan view of the camera module of FIG. 17.

Another example is illustrated schematically at FIG. 17 and FIG. 18, which show the structure in section and plan view, respectively. A flat substrate 1701 forms the base of the camera module 1700 of FIGS. 17 and 18. A purpose of substrate 1701 is to provide structural support, and so suitable materials include metals (e.g., titanium), ceramics (e.g., alumina) and hard polymers like Bakelite. The substrate material may be molded or one or more other methods may be used to fabricate an array of through-holes 1703 in it. In certain embodiments, these through holes 1703 will eventually be fully or partially filled with conductive material as part of the structure that provides the electrical interface to the camera module 1700. Because the substrate 1701 contributes to the overall height of the camera module 1700, it is a very thin yet sufficiently rigid structure. The mechanical properties of the material of the substrate 1701, including its modulus and fracture toughness, are carefully selected in certain embodiments. The substrate 1701 may be around 200 microns thick, and can have a thickness be in a range between approximately 50 microns and 400 microns.

The image sensor 1705 and cover glass 1707 of camera module 1700 are coupled over roughly a central portion of the substrate 1701 in the example embodiment illustrated at FIGS. 17-18. The image sensor 1705 may be attached to the substrate 1701 using adhesive bonding 1709 or magnetically, or using one or more clips or complementary slide or twist fastening components, or using fit bonding utilizing static adhesion or thermal or compression shrink or expansion fitting, or otherwise. Over a substantial portion of the remainder of the substrate 1701 is attached a flexible circuit 1711. The method of attachment may be adhesive bonding 1709 or one of the just mentioned methods or otherwise. The flexible circuit 1711 may include in certain embodiments thin conductive tracks made of copper or other metal or conducting polymer on the surface of and/or embedded within a soft polymeric material like polyimide. Apertures or other features may be used to provide access to the copper tracks to make electrical connections.

As illustrated in the example of FIG. 17 and FIG. 18, the flexible circuit 1711 has an aperture 1713 that is smaller than the image sensor 1705 in plan area. This permits the flexible circuit 1711 to be placed over the image sensor 1705, such that the bond pads 1715 on the image sensor 1705 are covered by the flexible circuit 1711. In this way, electrical joins may be made between the bond pads 1715 on the image sensor 1705 and suitable lands on the flexible circuit 1711. A wide choice of methods and materials are used in accordance with several embodiments to effect such joins, with examples including conductive adhesives, thermo-compression bonds, soldered joints, and ultrasonic welds.

The image sensor 1705 is connected or connectable electrically to the flexible circuit 1711, enabling tracking on a flexible circuit in accordance with certain embodiments to be used to route electrical connections to other sites, which may include active and/or passive components 1717. Active and/or passive components 1717 can be attached and interconnected to the flexible circuit 1711 in various embodiments using established methods and techniques. In FIG. 17 and FIG. 18, three (3) passive components 1717 are included in the camera module 1700, along with ten (10) bond pads 1715 and eight (8) through-hole solder interconnects 1721, but these numbers and locations and shapes and sizes are provided by way of illustration and many variations are possible.

External electrical connection to the camera module 1700 involves in certain embodiments electrical connection to suitable lands on the flexible circuit 1711. By design, these lands are advantageously located over the through holes 1703 in the substrate 1701. Although FIG. 17 and FIG. 18 depict pillars of solder for these electrical interconnects 1721, the electrical interconnects 1721 could be fabricated from a variety of materials and structures including copper pillars, stacked stud bumps, conductive adhesives and/or deep access wire bonds. Other embodiments include mechanical structures like sprung elements and pogo pins. Where solder pillars are used, on reflow of the solder, the periphery will change shape into a hemisphere so that the external interface of the camera module 1700 resembles an interconnect for semiconductor packages similar to a ball grid array. The example structure shown in FIG. 17 and FIG. 18 includes a flexible circuit 1711 that has slight bends 1723 and flexure slots 1725, while in other embodiments, the flexible circuit does not have a bend.

Figure 19:
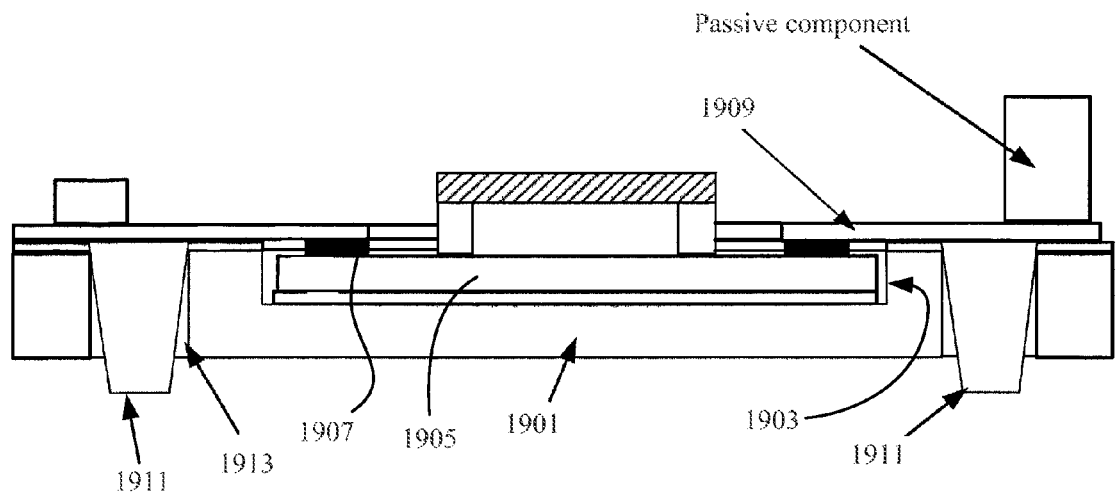
FIG. 19 schematically illustrates a section view of another camera module with copper pillar interconnects in accordance with certain embodiments.
Figure 20:
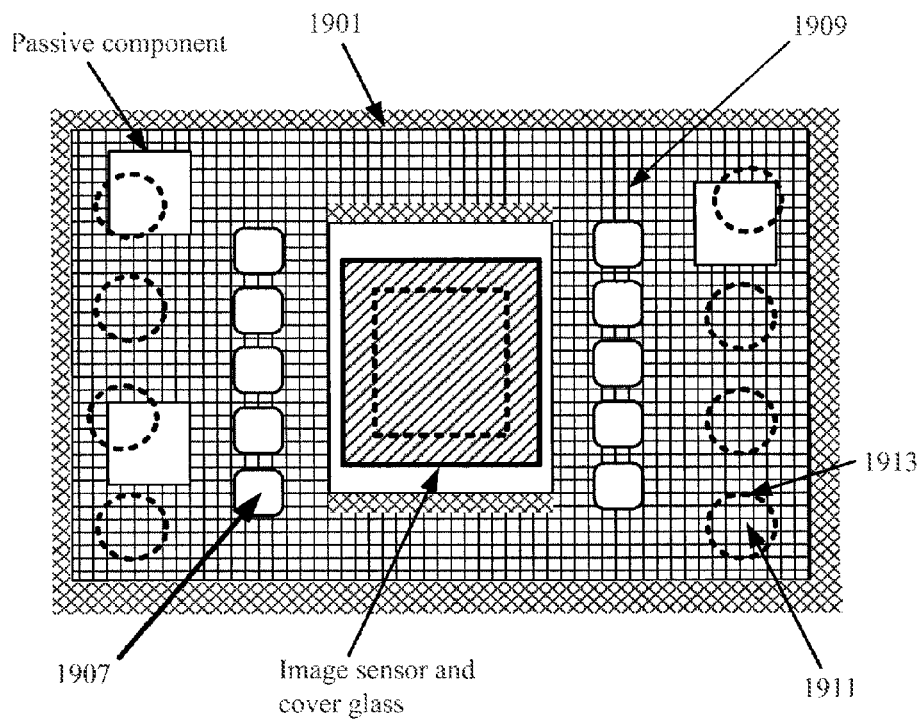
FIG. 20 schematically illustrates a plan view of the camera module of FIG. 19.

FIG. 19 and FIG. 20 schematically illustrate in section and plan view an embodiment that addresses this issue of having a bend in the flexible circuit. In FIGS. 19 and 20, an image sensor 1905 is disposed in a recess 1903 in the substrate 1901, such that image sensor bond pads 1907 are on the same level as the underside of the flexible circuit 1909, and the flexible circuit 1909 illustrated at FIG. 19 does not have a bend like that of FIG. 17. Some adjustment to the detail of this alignment may take into account the thickness of the joining medium used to attach and connect the flexible circuit 1909 to the bond pads 1907. A wide variety of methods and structures can be used for connection to the camera module, and in the example of FIG. 19 tapered copper pillars 1911 that are disposed in through holes 1913 in the substrate 1901 are illustrated, although ball grid arrays and solder interconnects may be used.

Figure 21:
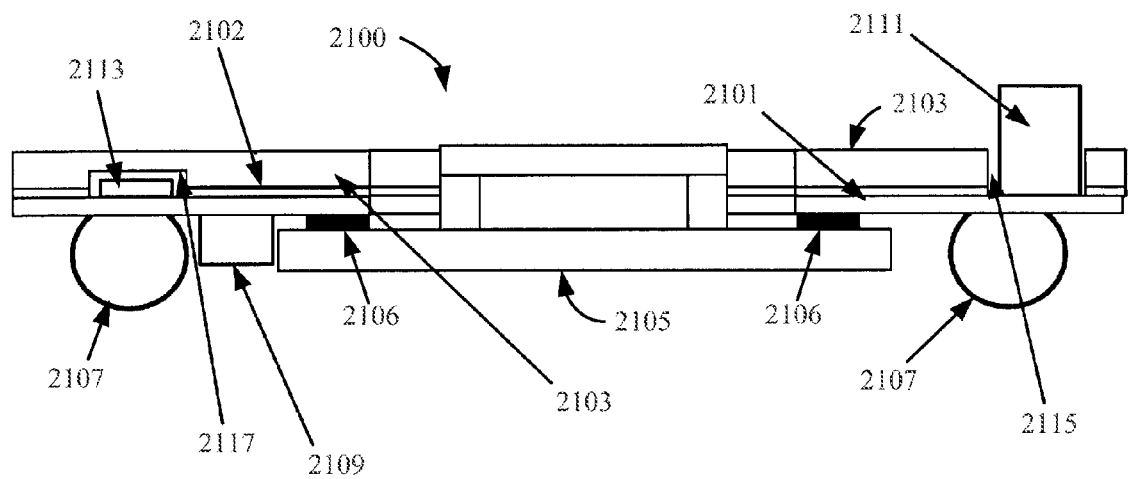
FIG. 21 schematically illustrates a section view of another camera module with ball grid array interconnects in accordance with certain embodiments.
Figure 22:
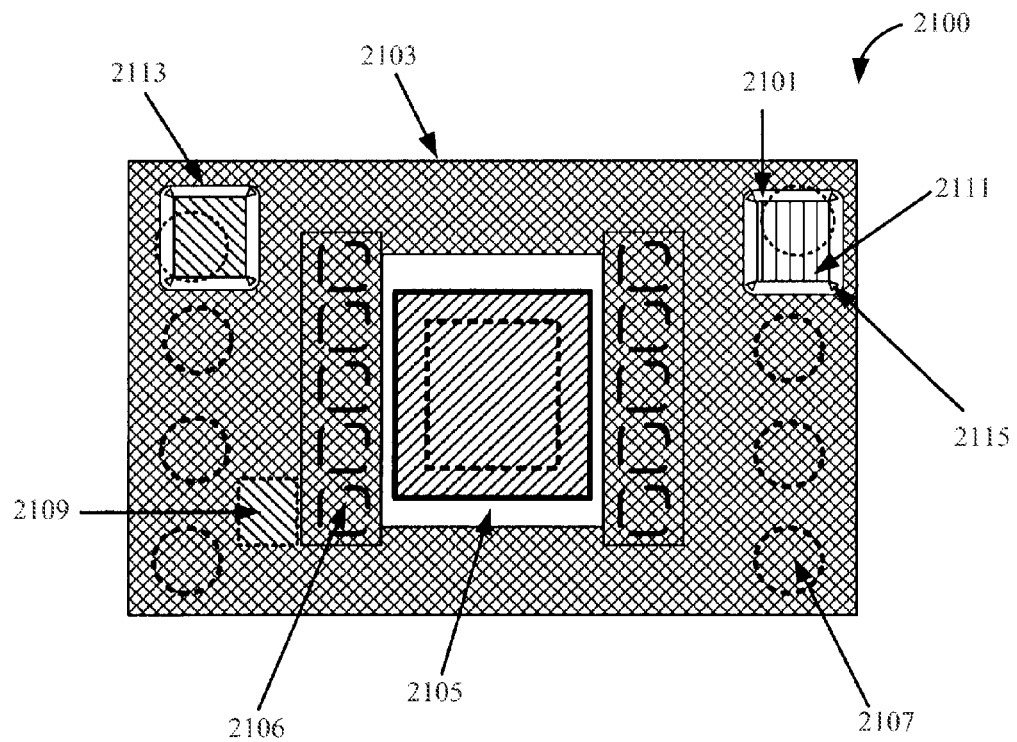
FIG. 22 schematically illustrates a plan view of the camera module of FIG. 21.

Another embodiment of a camera module or camera module component 2100 is illustrated schematically at FIG. 21 and FIG. 22. In this instance, the flexible circuit 2101 is located on (e.g., joined by an adhesive 2102 to) the underside of the substrate 2103, both of which are located above the image sensor 2105, which is coupled to flexible circuit via bond pads 2106. This configuration has the advantage that the substrate 2103 and external electrical connections 2107 do not increase the camera module height. The electrical connections 2107, in this instance are depicted as a ball grid array, but any of the previously disclosed methods and structures could equally be employed, such as copper pillars or solder interconnects. Placing the substrate 2103 on top of the flexible circuit 2101 could mean that the upper side of the flexible circuit 2101 is unavailable for carrying passive and active components. However, the examples illustrated in FIG. 21 and FIG. 22 provide means for accommodating passive and active components 2109, 2111, and 2113 despite the substrate 2103 being positioned on top of flexible circuit 2101. One example is to make through holes 2115 in the substrate 2103 at suitable locations. The components (e.g., passive component 2111) can then be placed on the flexible circuit 2101 that is exposed. Similarly, a component-first assembly order may be performed, and the substrate can contain cavities, such as cavity 2117, that make space for components, such as component 2113, attached to the flexible circuit 2203. A third example places the components, such as component 2109, on the underside of the flexible circuit 2101, that is, on the same side as the electrical connections 2107 to the camera module 2100. Each example structure has somewhat different advantages depending on the number and dimensions of the components included in the particular camera module embodiment. All three of these examples could be employed at the same time in a fourth embodiment.

Figure 23:
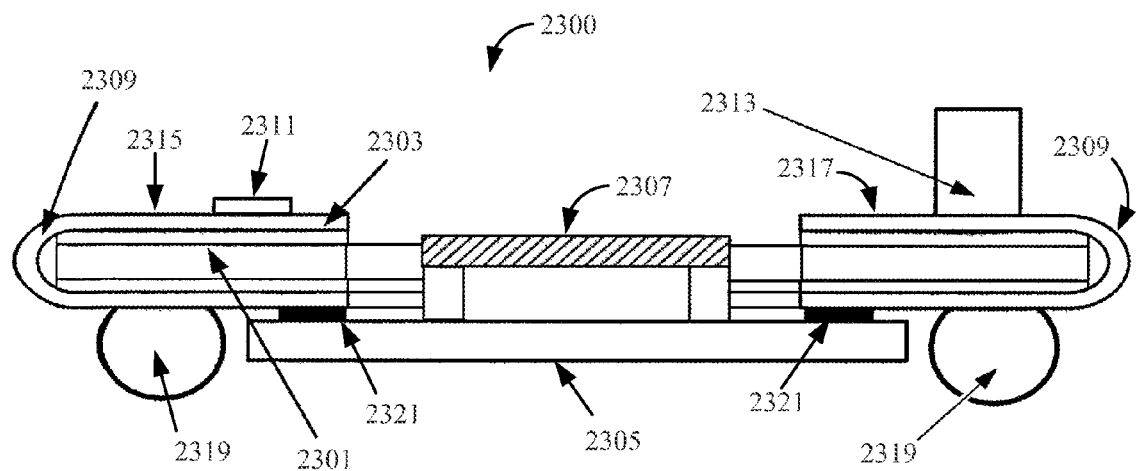
FIG. 23 schematically illustrates a section view of another camera module with fold over flex circuit and ball grid array interconnects in accordance with certain embodiments.
Figure 24:
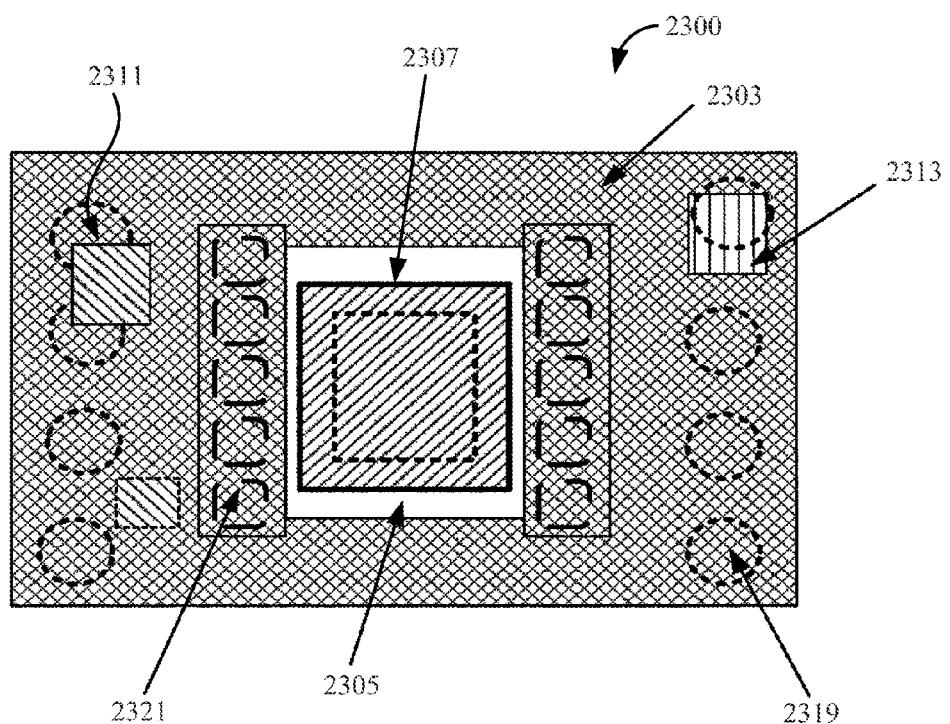
FIG. 24 schematically illustrates a plan view of the camera module of FIG. 23.

The camera module or camera module component 2300 shown in section and plan view in FIG. 23 and FIG. 24 allows the substrate 2301 to be or to include a single slab of material with a cut-out for the image sensor 2305 and cover glass 2307. The flexible circuit 2303 is shown folded in FIG. 23 and as such may be referred to as a fold-over flexible circuit 2303 that includes folds 2309. As shown in FIG. 23, passive components 2311 and 2313 are located on the fold-over portions 2315 and 2317 of flexible circuit 2303. Similar to prior examples, external electrical connections 2319 comprise a ball grid array, and the image sensor 2305 is electrically coupled to the flexible circuit 2303 via bond pads 2321.

Figure 25:
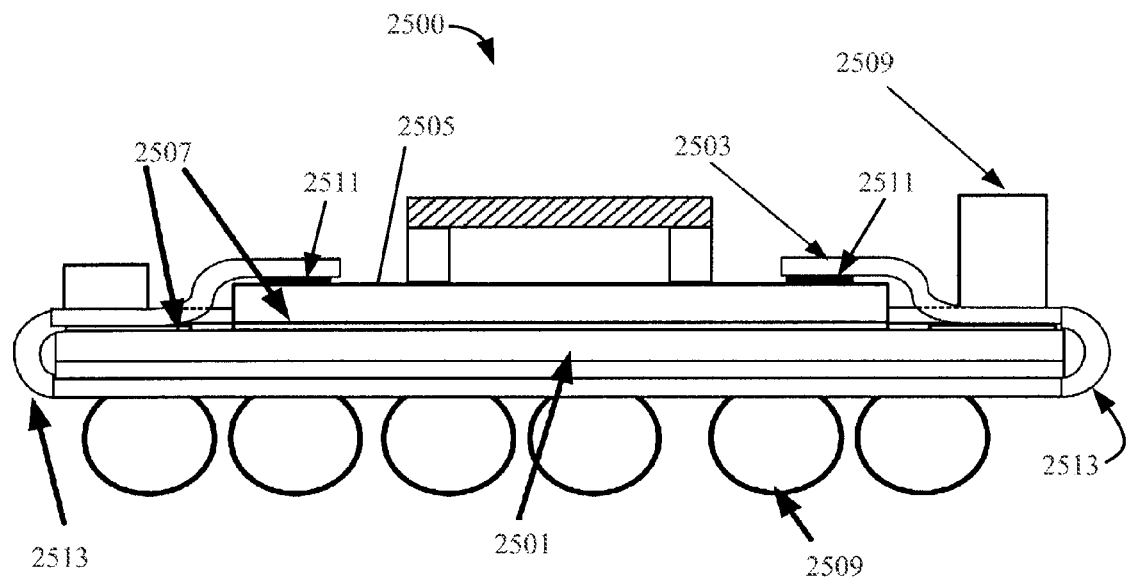
FIG. 25 schematically illustrates a section view of another camera module with fold over flex circuit and ball grid array interconnects in accordance with further embodiments.

FIG. 25 schematically illustrates a camera module or camera module component 2500 that includes a substrate 2501, that is or that includes a completely monolithic slab of material, a flexible circuit 2503, and an image sensor die 2505 mounted on the substrate 2501 by an adhesive join 2507. As shown in FIG. 25, electrical connections 2509 to the camera module 2500 comprise a ball grid array. Optionally in the scheme shown in FIG. 25, the image sensor 2505 could be recessed in a cavity, so that the flexible circuit 2503 is on a level with the bond pads 2511, in the same way FIG. 19 shows this modification of FIG. 17. The structures shown in FIGS. 23 through 25 may involve folds 2513, such as described in the Fold Over technology such as that described at U.S. Pat. No. 7,368,695 and/or US published patent applications nos. US20050279916 and/or US20050150813, which are incorporated by reference. In certain embodiments that include fold over technology, a flexible circuit (e.g., flexible circuit 2503) is bent through a 180 degree arc to facilitate electrical connectivity between two opposing surfaces of a substrate thereby obviating through-holes in the substrate. The structure of FIG. 25 has the particular advantage that a significant area of the underside of the camera module 2500 is available to support the external electrical interface. This is advantageous when a high connection density, in terms of the number of contacts per unit area, is desired. Making a dense array of through holes could result in structural weakness if the density becomes high enough.

Figure 26:
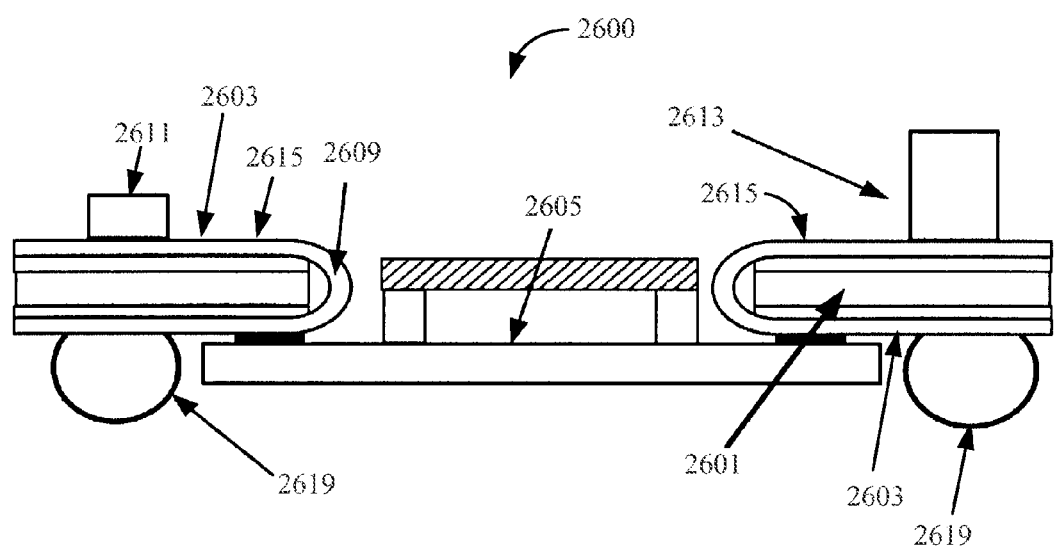
FIG. 26 schematically illustrates a section view of another camera module with fold over flex circuit and ball grid array interconnects in accordance with further embodiments.

The position of the folds in the flexible circuit of the camera module illustrated at FIG. 23 can be alternatively located at the interior of the structure instead of at the exterior. The part can then appear as illustrated schematically at FIG. 26. As shown in FIG. 26, the camera module or camera module component 2600 includes a substrate 2601, a flexible circuit 2603, and an image sensor 2605. In contrast to FIG. 23, FIG. 26 shows that the folds 2609 in the flexible circuit 2603 are located at the interior of the structure over the image sensor 2605. FIG. 26 also includes passive components 2611 and 2613 coupled to the fold-over portions 2615 of the flexible circuit 2603, and the flexible circuit 2603 includes a ball grid array 2619 as external electrical connections for the camera module 2600. This structure advantageously decreases the area of the camera module.

Camera Module with Flip-Chip Imager

Figure 27A:
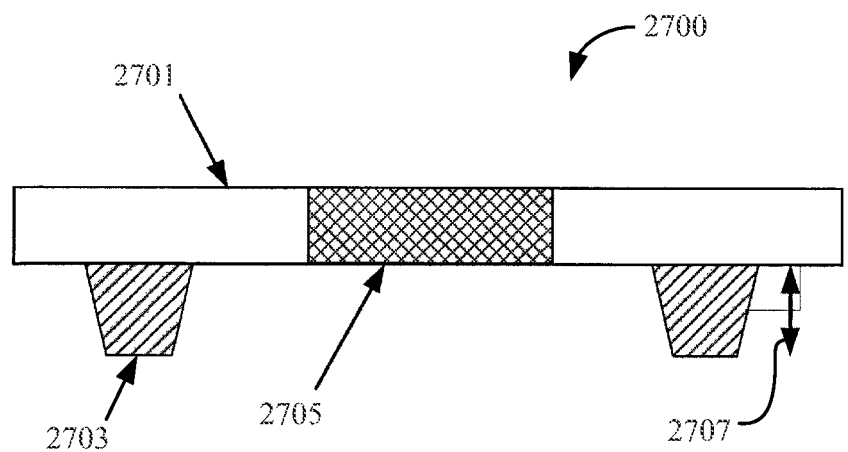
FIGS. 27A-27B schematically illustrate section and plan views of a flexible circuit with copper pillars or micropillars (μPILRs) in accordance with certain embodiments.
Figure 27B:
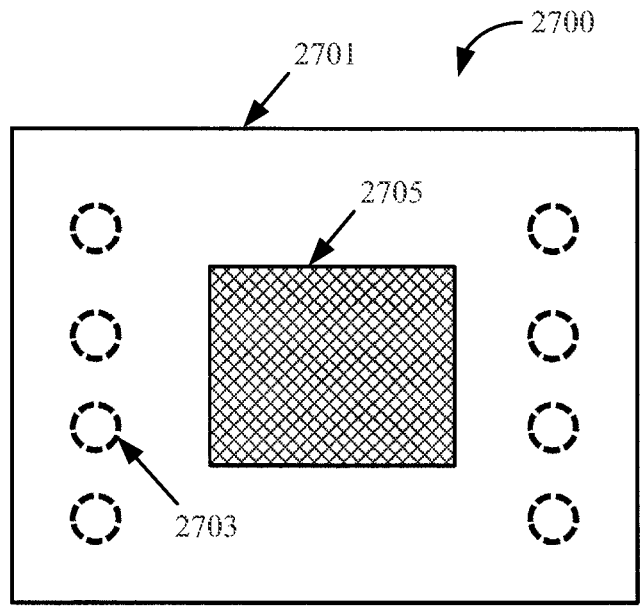

A double-sided flexible circuit 2701 with copper pillars or µPILRs 2703 and a punch window 2705 is schematically illustrated in section and plan views of the apparatus 2700 at FIGS. 27A-27B. A starting point for building camera modules in accordance with certain embodiments includes a circuit board or providing a circuit board that carries a wiring trace. Such circuit boards may be made of any of a plethora of materials and may have any of a variety of options. Flexible circuits are one of these options, which have an advantage that they carry high density wiring traces on both sides. In certain embodiments, an aperture is defined in the flexible circuit used with the camera module of camera module component. Furthermore, certain embodiments include a flexible circuit with copper pillar or µPILR interconnects on one face. The part then appears as depicted in section and plan view in FIGS. 27A-27B, respectively. The height 2707 of the copper pillars 2703 or µPILR interconnects 2703 of FIG. 27A exceeds the thickness of the imager die. This may be around 100 microns, but could range from about 50 microns minimum to 300 microns maximum for common image sensors.

Figure 28A:
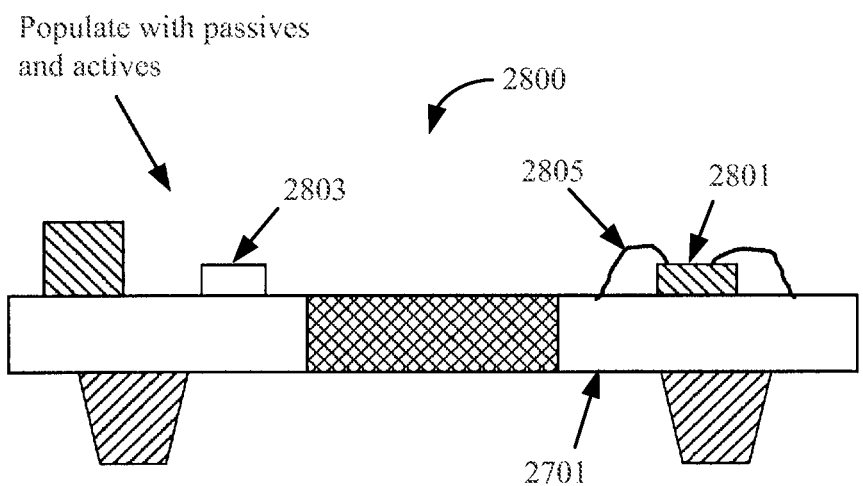
FIGS. 28A-28B schematically illustrate section and plan views of the flexible circuit of FIG. 27 populated with active and passive components in accordance with certain embodiments.
Figure 28B:
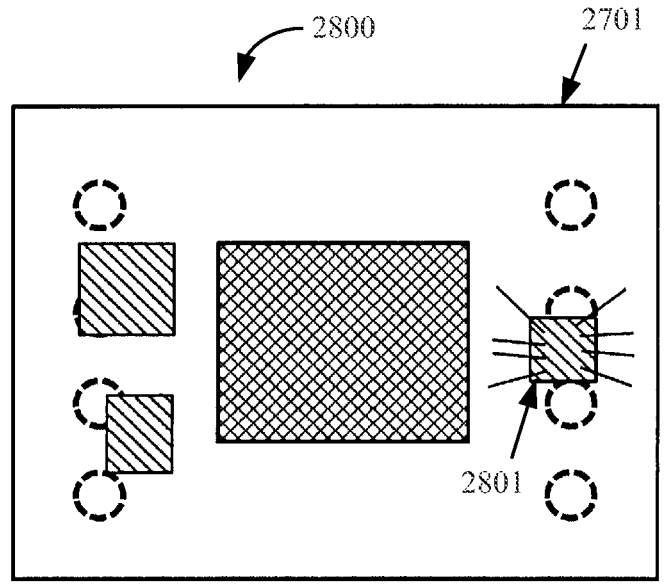

In certain embodiments, an imager or image sensor is included in a camera module or camera module component that involves one or more active and passive components supporting one or more electronic functions. These one or more components are advantageously located in certain embodiments in close proximity to the image sensor. For example, an image sensor associated with an ASIC in one embodiment has electrical output from the image sensor converted into a more common format like a jpeg file. These one or more active components 2801 and/or passive components 2803 may be located and interconnected on the upper surface of the flexible circuit 2701 in certain embodiments. In one embodiment, an ASIC 2801 is attached with die attach adhesive and interconnected by wire bonds 2805, while a capacitor 2803 is reflow soldered in place. The flexible circuit 2701, after population with the one or more active and/or passive components, then may appear in one example as the apparatus 2800 shown schematically in section and plan views in FIGS. 28A-28B.

Figure 29A:
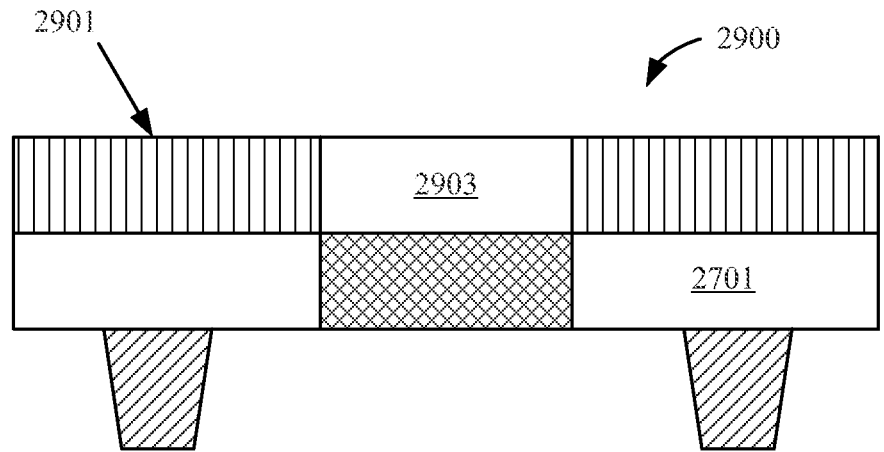
FIGS. 29A-29B schematically illustrate section and plan views of the flexible circuit of FIG. 28 with over-molded active and passive components in accordance with certain embodiments.
Figure 29B:
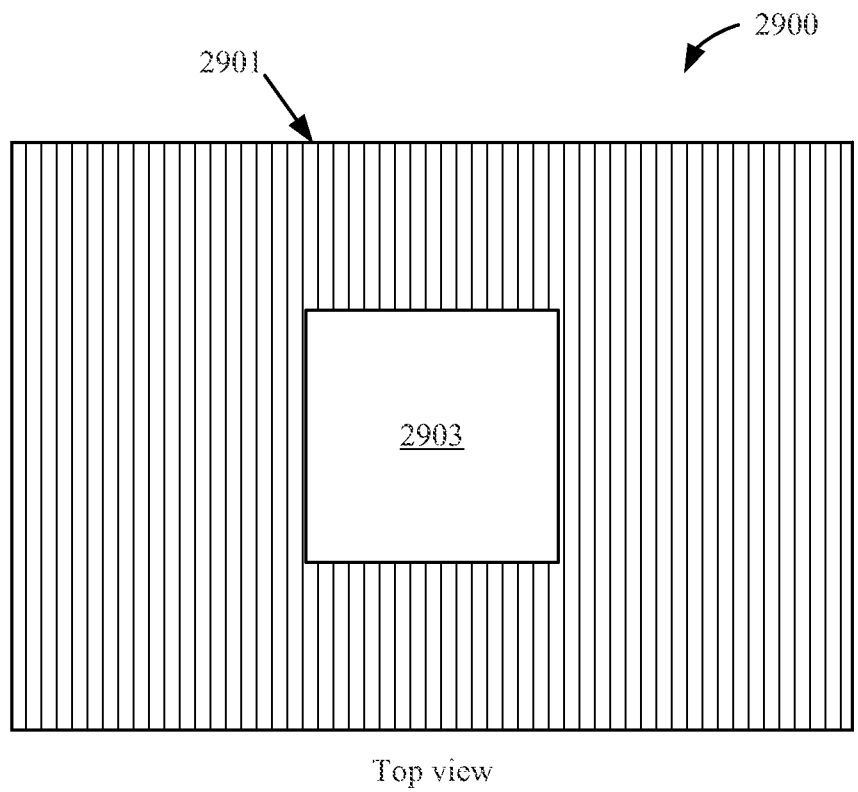

A flexible circuit (e.g., flexible circuit 2701) is, by definition, at least to some significant degree, flexible. A camera module in accordance with certain embodiments has this flexibility removed. In some embodiments, even more rigid circuit boards might not be stiff enough for use with a camera module. Accordingly, in certain embodiments, one or more active and/or passive components (e.g., active components 2801 and 2803) are over-molded with a molding material 2901 to define an aperture 2903, as schematically illustrated by the apparatus 2900 shown in FIGS. 29A-29B. Over-molding is provided in accordance with certain embodiments for encapsulating one or more electronic components in a polymeric material or other such flowable and curable material. The encapsulation provides good protection to the parts from the environment and also has relatively high modulus, thereby rendering the flexible circuit stiff.

Figure 30A:
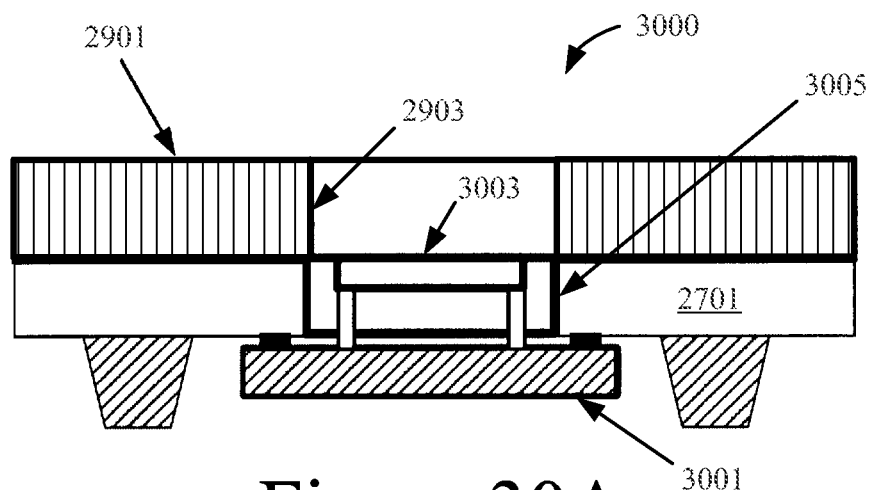
FIGS. 30A-30B schematically illustrates the flexible circuit of FIG. 29 with an attached and interconnected image sensor in accordance with certain embodiments.
Figure 30B:
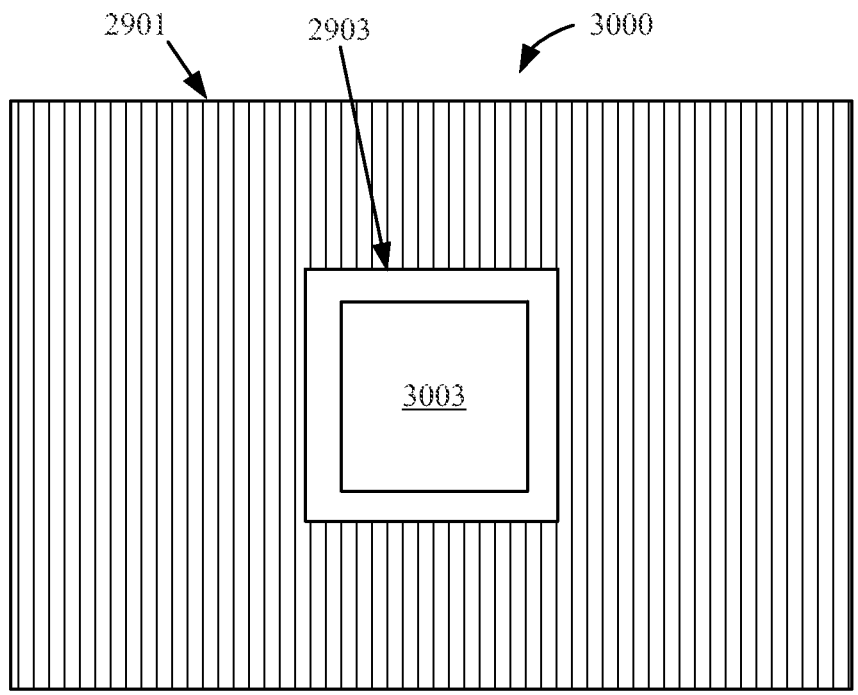

An image sensor 3001 may be attached and interconnected face-up, i.e., in flip-chip orientation, in certain embodiments to the underside of the flexible circuit 2701 as illustrated schematically by the apparatus 3000 at FIGS. 30A-30B. FIGS. 30A-30B illustrate the stiffening provided by the overmold 2901 permitting the image sensor 3001 to be attached to a relatively inflexible member. Many embodiments involving flip-chip attachment and interconnection of semiconductor die directly or indirectly provide a substrate with a high modulus. Examples of components and processes that may be used in accordance with certain embodiments include, but are not limited to, conductive adhesives, thermo-compression bonding, thermo-sonic bonding, and soldering.

The image sensor die 3001 drawn in FIGS. 30A-30B includes an enclosure 3003 over the optically active area. In alternative embodiments, the image sensor die 3001 could also be bare. The aperture 3005 in the flexible circuit 2701 corresponds to the punch window 2705 (see FIGS. 27A-B) and is at least as large in dimension as the optically active area of the image sensor die 3001 in most embodiments. In those embodiments where this is not the case, the flexible circuit 2701 and overmold 2901 actually stop some light from the scene reaching the covered portions of the image sensor.

A solid state camera module in accordance with certain embodiments may be described as including two general components. These are the image sensor and its associated electronic components, and the optical train. The optical train comprises lenses, apertures, stops, baffles and filters that are used to convey the light from the scene into a focused image on the optically active area of the imager. Optical trains suitable for miniature cameras are well known and understood. Typically, the optical train is mounted in a lens turret. The lens turret has a screw thread that fits inside a lens barrel. Rotating the turret with respect to the barrel permits adjustment of the focus of the camera.

Figure 31A:
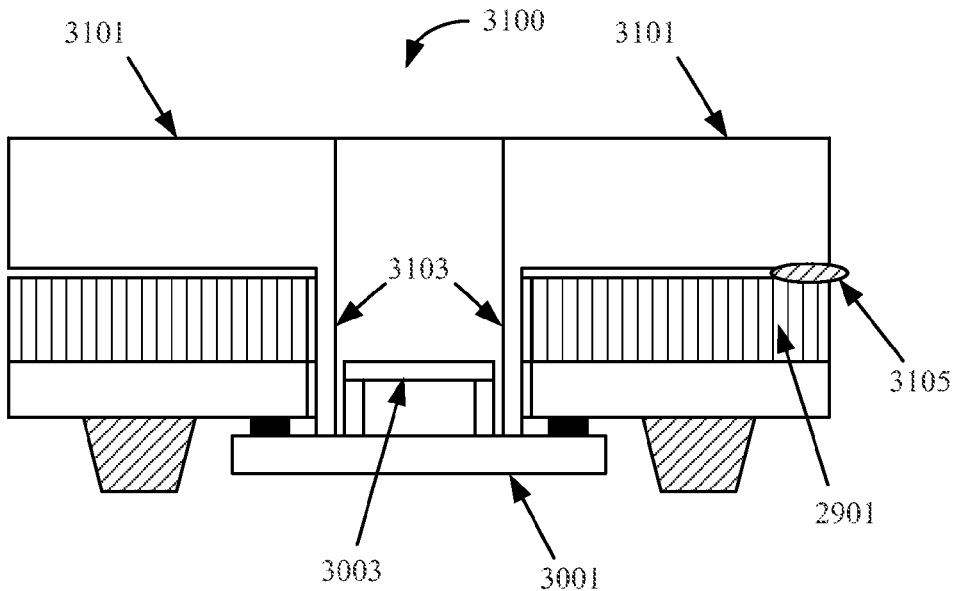
FIGS. 31A-31B schematically illustrate the flexible circuit with attached image sensor of FIG. 30 with reference lens barrel in accordance with certain embodiments.
Figure 31B:
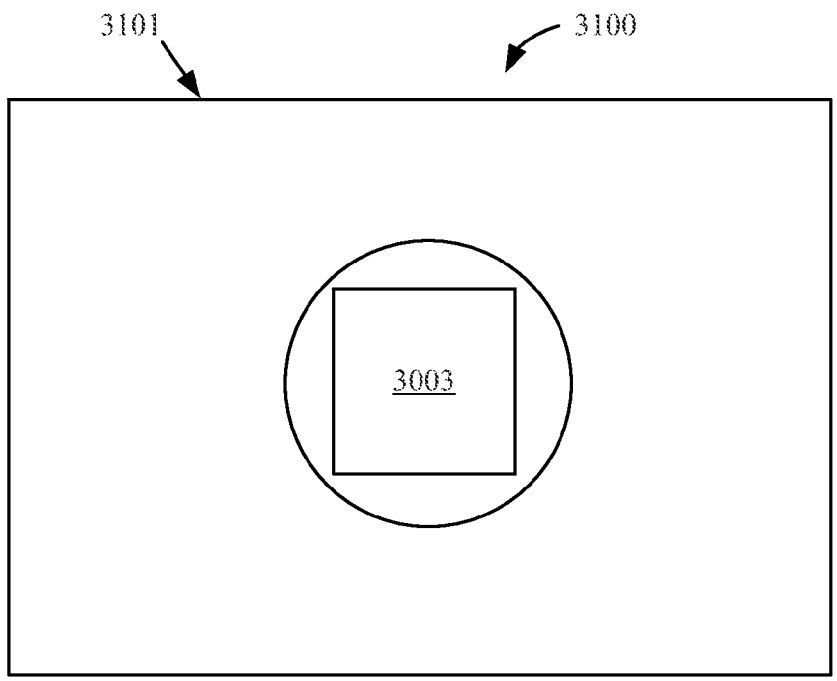

In fabricating a camera module, the image quality depends significantly on the alignment of the optical train to the image sensor. In particular, the optical axes of the image sensor and optical train are advantageously aligned in tilt and translation in embodiments described herein. The accuracy of the alignment depends on the position of the lens barrel and is referenced in certain embodiments directly to the image sensor and in other embodiments is referenced to the image sensor through one or more intermediate components. FIGS. 31A-31B schematically illustrate an example of a structure 3100 through which this is advantageously accomplished by attaching a lens barrel 3101 to the apparatus 300 of FIGS. 30A-30B. The lens barrel 3101 of FIG. 31A contains one or more lens barrel extensions 3103 that abut the surface of the image sensor die 3001. Using this touching of the image sensor die 3001 by the lens barrel 3101 having one or more lens barrel extensions 3103, the tilt of the lens barrel 3101 with respect to the image sensor die 3001 is advantageously controlled. Translation of the lens barrel 3101 with respect to the image sensor die 3001 is advantageously accomplished by passive optical alignment. Having located the lens barrel 3101 in the desired position, it can be fixed in place by a variety of bonding methods. The product illustrated in FIGS. 31A-31B may be manufactured by applying and curing a UV adhesive 3105 between the lens barrel 3101 and the overmold material 2901.

Figure 32A:
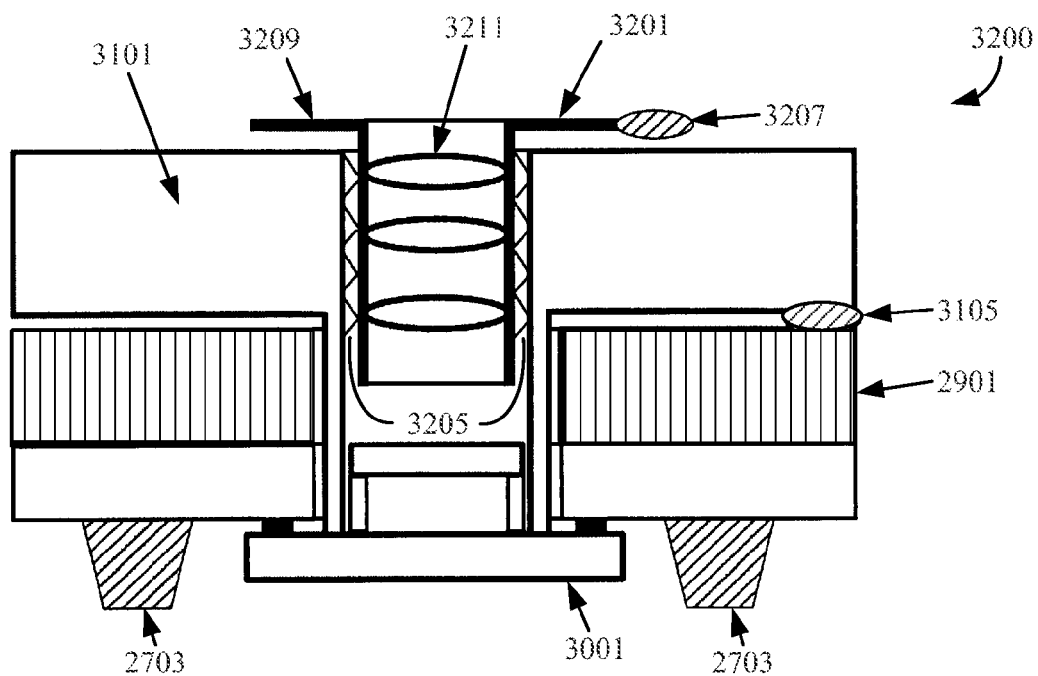
FIGS. 32A-32B schematically illustrate section and plan views of the flexible circuit with attached image sensor and reference lens barrel of FIGS. 31A-31B with screw-in lens turret in accordance with certain embodiments.
Figure 32B:
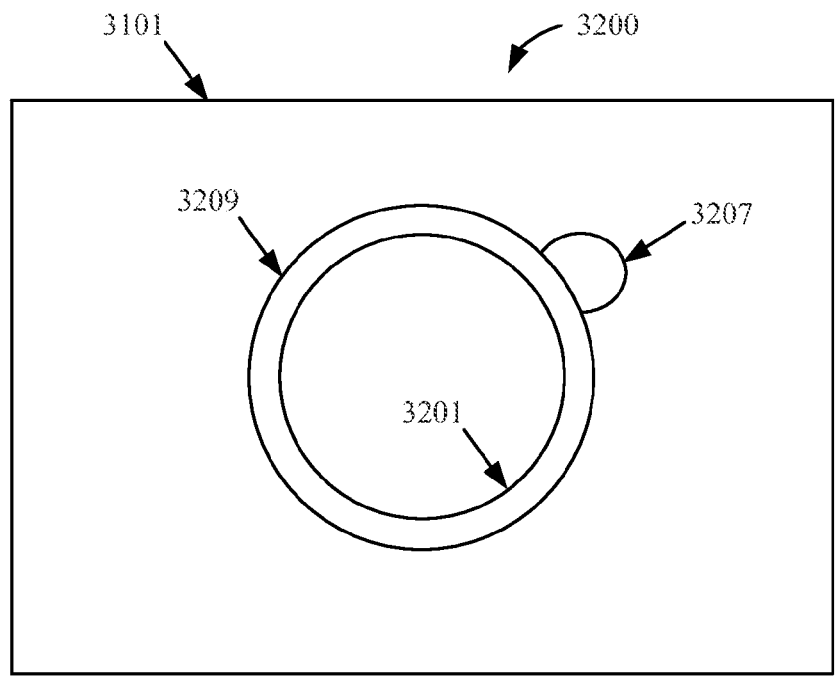

Another step of manufacture of a camera module that may be advantageously used in certain embodiments involves insertion of a lens turret 3201 into the lens barrel 3101, e.g., using a screw thread 3205 or complementary locking pin and slot components, such as shown in the camera module 3200 of FIGS. 32A-32B. In the screw thread embodiment, for example, by adjusting the screw thread 3205, the camera focus can be set as desired and optionally locked in this position by an adhesive 3207. In FIGS. 32A-32B, a camera module 3200 is schematically illustrated in section and plan views that utilizes UV cure adhesive 3207. The lens turret 3201 is also shown to include an upper flange 3209 and multiple lenses, including an upper-most lens 3211. Although FIGS. 32A-32B show a camera module 3200 that utilizes copper pillars or μPILRs 2703 for the camera module interface, other embodiments use mechanical elements such as springs and/or pogo pins, and/or solder balls to form a ball grid array interface.

Packaging Methods for Flip Chip Sensor Camera Modules

Reduction of camera module Z height, cost, and manufacturing yield loss through the use of various methods and components including packaging a flip-chip image sensor are described herein. One method uses a Rigid-Flex printed circuit (RFPC) with a hole for a flip-chip sensor and protective encapsulation of the image sensor on the bottom side of the RFPC. Another method uses the same bottom-side encapsulated flip-chip image sensor, but substitutes a rigid substrate with flexible printed circuit (FPC) attached to the top-side of the substrate, e.g., using Anisotropic Conductive Film (ACF).

The overall height of a camera module depends on the mechanical height from the top of the lens to the image plane on the top surface of the image sensor, plus the thickness of the image sensor chip, and anything below the image sensor. In certain embodiments, there is an epoxy bond and a substrate below the image sensor. A flip-chip image sensor is used in certain embodiments which serves to advantageously decrease the camera module Z height, because the sensor is moved down to a cavity on the bottom side of the substrate. This means that substrate is moved upward in the optical path and no longer adds thickness below the image sensor. A ceramic substrate is used in certain embodiments, which is very rigid and relatively expensive. In order to make the connection from the camera module to the customer device, a flexible printed circuit (FPC) is attached in some embodiments to the bottom of this substrate with solder or anisotropic conductive film (ACF).

Figure 35:
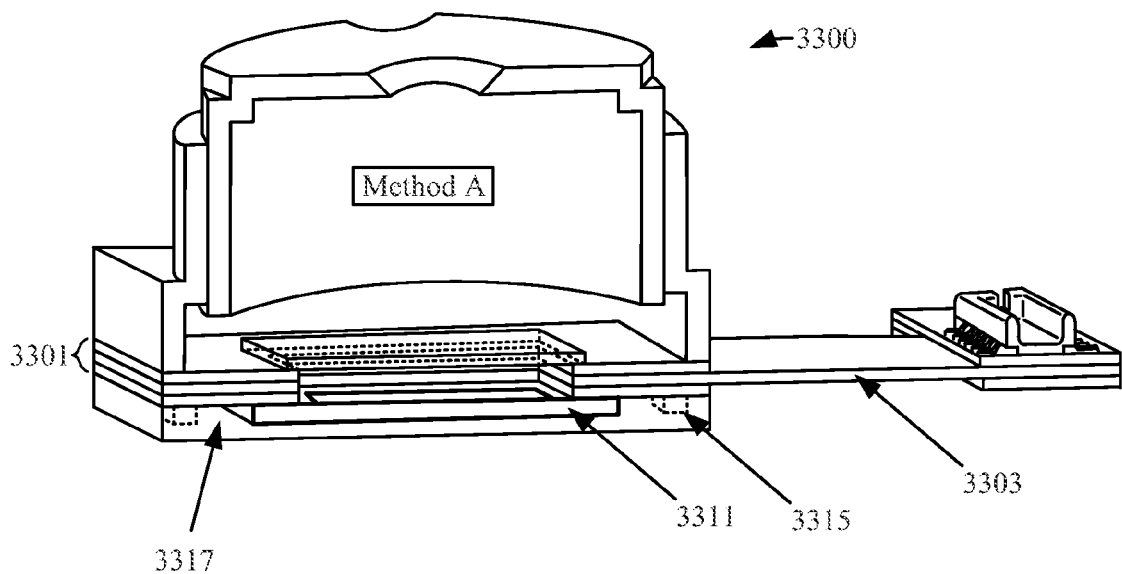
FIG. 35 schematically illustrates a section view of a camera module with RFPC packaging in accordance with a further embodiment.

The Z height of the camera module may be reduced by moving the FPC above the bottom of the image sensor so that it does not add to the Z height of the camera module. In one embodiment of a camera module 3300 illustrated schematically at FIGS. 33 and 35, the substrate is a rigid-flex printed circuit (RFPC) 3301, which may be constructed of an FPC 3303 sandwiched between top and bottom rigid circuit board layers 3305 and 3307, respectively. This substrate 3301 may have a hole 3309 such that the flip-chip image sensor 3311 may be attached to the bottom side of the substrate 3301. A cover 3313 can be coupled to the substrate 3301 over the hole 3309. Unlike a ceramic substrate with a cavity, an image sensor 3311 in accordance with this embodiment is exposed on the bottom of the substrate 3301 rather than in a cavity. To improve the strength and reliability of the camera module 3300, the image sensor 3311 and surrounding components 3315 (e.g., SMT components) may be encapsulated in epoxy or other material 3317. This encapsulation advantageously offers a large surface that can be used to transfer thermal energy (heat) away from the image sensor 3311.

Figure 33:
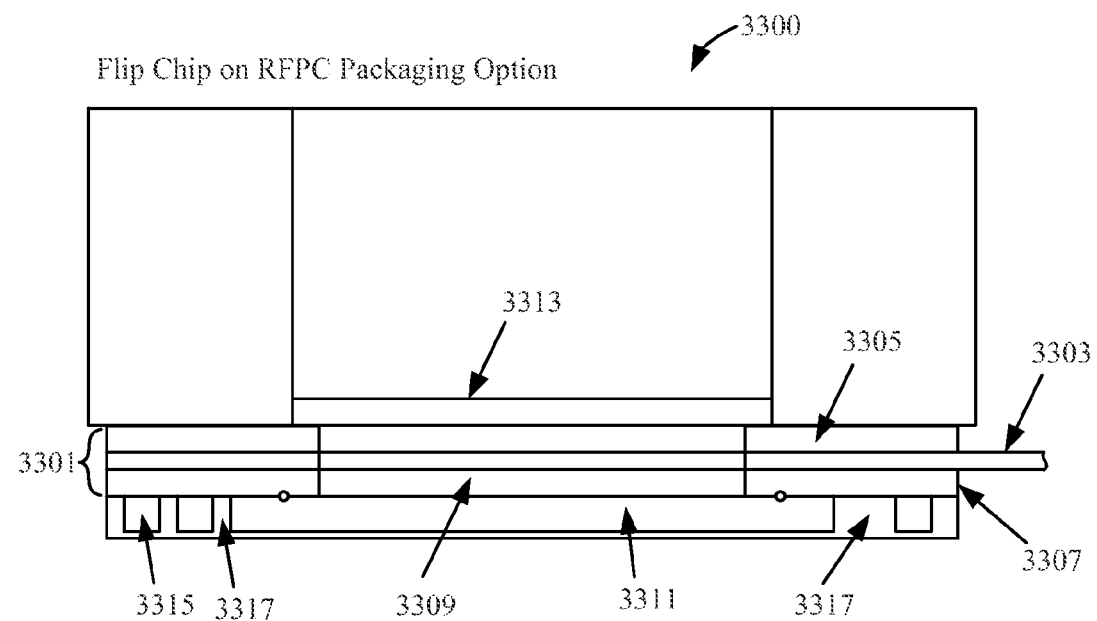
FIG. 33 schematically illustrates a section view of a flip chip camera module with a rigid flexible printed circuit or RFPC packaging option in accordance with certain embodiments.
Figure 34:
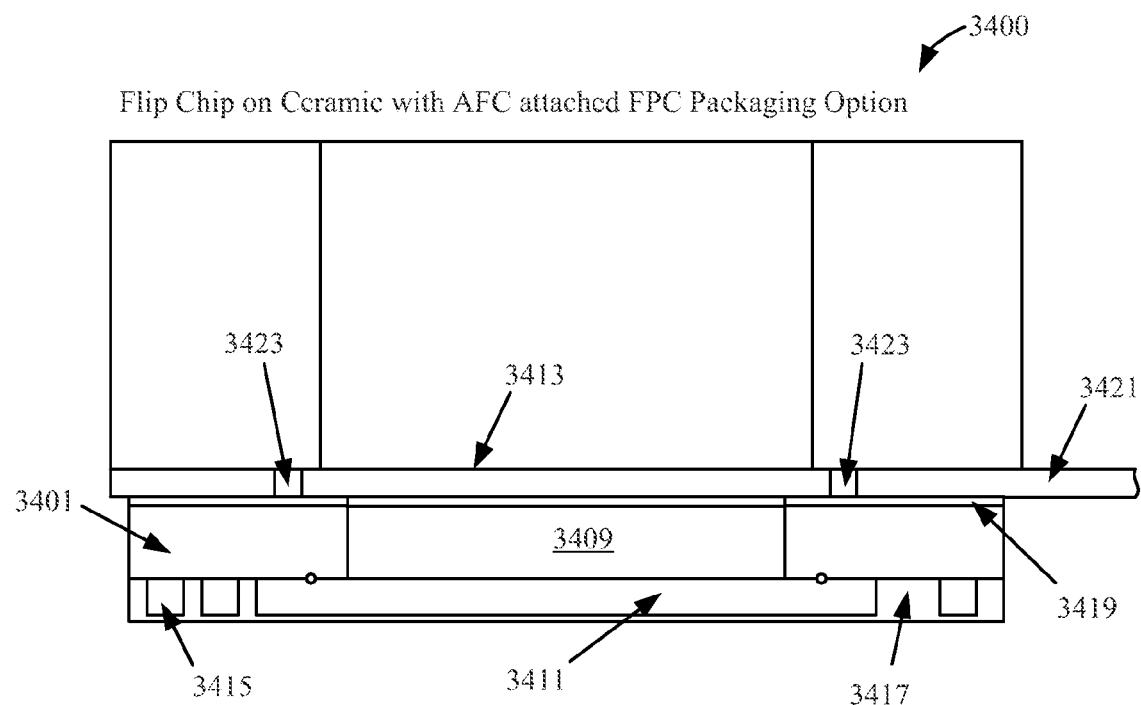
FIG. 34 schematically illustrates a section view of a flip chip camera module on ceramic with an anisotropic conductive film (ACF) attached flexible printed circuit (FPC) packaging option in accordance with certain embodiments.
Figure 36:
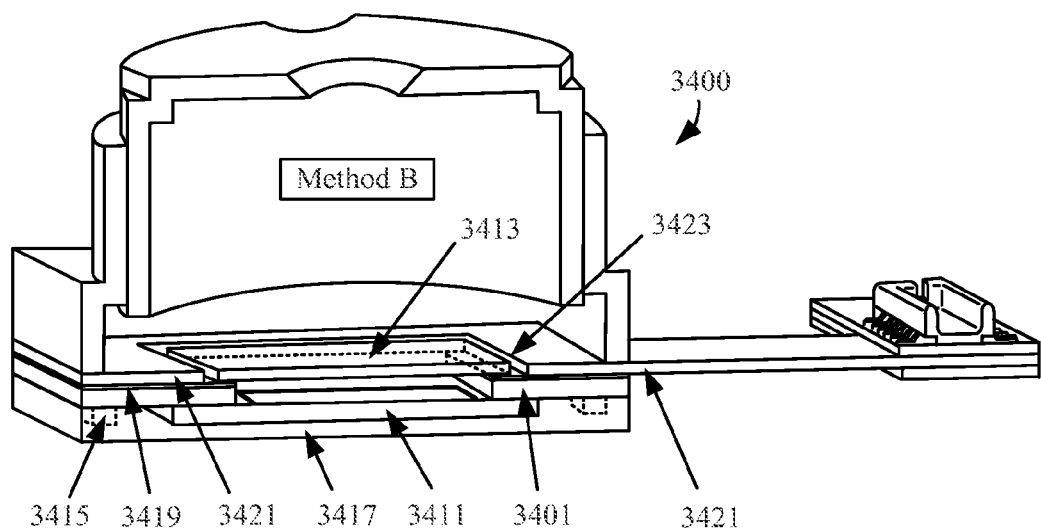
FIG. 36 schematically illustrates a section view of a camera module with combination FPC and rigid circuit board (RCB) packaging in accordance with a further embodiment.

In another embodiment of a camera module 3400 illustrated schematically at FIGS. 34 and 36, the substrate is or includes a rigid circuit board 3401. The camera module 3400 can also include a hole 3409, a flip-chip image sensor 3411, a cover 3413, surrounding components 3415, and encapsulation material 3417, which are the same as the respective components in the just-described embodiment in FIG. 33. However, camera module 3400 uses anisotropic conductive film (ACF) 3419 to attach an FPC 3421 to the top of the rigid substrate 3401. The top-mounted FPC 3421 in this embodiment may be made with a hole 3423 through which the image will pass down to the sensor. In certain embodiments, the substrate has this hole and no cavity, and the camera module does not include the ceramic component. Instead, the substrate includes in these embodiments organic materials such as, but not limited to, FR4 (glass reinforced epoxy laminate) or BT (BismaleimideTriazine).

Both of the structures of FIGS. 33 and 34 may avoid optionally the use of a ceramic substrate with a cavity. In addition to a reduction of Z height, the elimination of the ceramic cavity substrate can serve to reduce cost, improve manufacturing yield, and decrease the X and Y size of the camera module. Cost is reduced because ceramic cavity substrates are more expensive than organic material substrates such as RFPC, BT, and FR4. Manufacturing yield is improved because the image sensor bond pad locations have tighter tolerances on organic substrates than on ceramic cavity substrates, which decreases uncertainty in manufacturing. The X and Y size of the camera module is decreased because fitting the vertical walls (which have a minimum thickness equal to the thickness of the substrate) of a cavity can be avoided.

A flip-chip sensor may be used on a substrate that does not have a cavity in certain embodiments. A flip-chip sensor may be encapsulated with epoxy or other material in certain embodiments. A flip-chip may be used on an organic rigid-flex circuit board (RFPC) in certain embodiments. Anisotropic conductive film (ACF) may be used to connect a flexible circuit board (FPC) to the TOP side of a rigid camera module substrate in certain embodiments. In this embodiment, the top-mounted FPC has a hole through which the image may pass.

While an exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention.

In addition, in methods that may be performed according to preferred embodiments herein and that may have been described above, the operations have been described in selected typographical sequences. However, the sequences have been selected and so ordered for typographical convenience and are not intended to imply any particular order for performing the operations, except for those where a particular order may be expressly set forth or where those of ordinary skill in the art may deem a particular order to be necessary.

In addition, all references cited above and below herein are incorporated by reference, as well as the background, abstract and brief description of the drawings, and U.S. application Ser. Nos. 12/213,472, 12/225,591, 12/289,339, 12/774,486, 13/026,936, 13/026,937, 13/036,938, 13/027,175, 13/027,203, 13/027,219, 13/051,233, 13/163,648, 13/264,251, and PCT application WO/2007/110097, and U.S. Pat. Nos. 6,873,358, and RE42,898 are each incorporated by reference into the detailed description of the embodiments as disclosing alternative embodiments.

The following are also incorporated by reference as disclosing alternative embodiments:

U.S. Pat. Nos. 8,055,029, 7,855,737, 7,995,804, 7,970,182, 7,916,897, 8,081,254, 7,620,218, 7,995,855, 7,551,800, 7,515,740, 7,460,695, 7,965,875, 7,403,643, 7,916,971, 7,773,118, 8,055,067, 7,844,076, 7,315,631, 7,792,335, 7,680,342, 7,692,696, 7,599,577, 7,606,417, 7,747,596, 7,506,057, 7,685,341, 7,694,048, 7,715,597, 7,565,030, 7,636,486, 7,639,888, 7,536,036, 7,738,015, 7,590,305, 7,352,394, 7,564,994, 7,315,658, 7,630,006, 7,440,593, and 7,317,815, and U.S. patent application Ser. Nos. 13/306,568, 13/282,458, 13/234,149, 13/234,146, 13/234,139, 13/220,612, 13/084,340, 13/078,971, 13/077,936, 13/077,891, 13/035,907, 13/028,203, 13/020,805, 12/959,320, 12/944,701 and 12/944,662, and United States published patent applications serial nos. US20120019614, US20120019613, US20120008002, US20110216156, US20110205381, US20120007942, US20110141227, US20110002506, US20110102553, US20100329582, US20110007174, US20100321537, US20110141226, US20100141787, US20110081052, US20100066822, US20100026831, US20090303343, US20090238419, US20100272363, US20090189998, US20090189997, US20090190803, US20090179999, US20090167893, US20090179998, US20080309769, US20080266419, US20080220750, US20080219517, US20090196466, US20090123063, US20080112599, US20090080713, US20090080797, US20090080796, US20080219581, US20090115915, US20080309770, US20070296833 and US20070269108.

What is claimed is:

1. A solid state camera module, comprising:
   an over-molded circuit board containing an aperture;
   an image sensor coupled in flip-chip orientation to the circuit board and including an optically active area that is aligned to the aperture;
   a lens barrel coupled to the circuit board and being physically aligned to the image sensor by contacting a top surface of the image sensor through the aperture; and
   electrical interconnections between the circuit board and the image sensor.

2. The solid state camera module of claim 1, wherein the lens barrel includes a plurality of barrel extensions that are configured to provide physical tilt alignment to the image sensor by touching the top surface of the image sensor through the aperture.

3. The solid state camera module of claim 1, wherein the electrical interconnections comprise one or more μPILR interconnects.

4. The solid state camera module of claim 3, wherein at least one μPILR interconnect has a height that exceeds a thickness of the image sensor.

5. The solid state camera module of claim 3, wherein at least one μPILR interconnect comprises copper.

6. A solid state camera module, comprising:
   a printed circuit having a molding formed thereon and containing an aperture through the printed circuit board and the molding;

an image sensor coupled in flip-chip orientation to the circuit board and including an optically active area that is aligned to the aperture;
a lens barrel coupled to the circuit board and the molding, the lens barrel being physically aligned to the image sensor by contacting a top surface of the image sensor through the aperture; and
electrical interconnections between the circuit board and the image sensor.

7. The solid state camera module of claim 6, wherein the lens barrel includes a plurality of barrel extensions and is configured with physical alignment to the image sensor by touching the lens barrel to a top surface of the image sensor with the plurality of barrel extensions through the aperture.

8. The solid state camera module of claim 6, wherein the lens barrel is configured with physical tilt alignment by said touching.

9. The solid state camera module of claim 6, wherein the electrical interconnections comprise one or more μPILR interconnects.

10. The solid state camera of claim 9, wherein at least one μPILR interconnect has a height that exceeds a thickness of the image sensor.

11. The solid state camera of claim 9, wherein at least one μPILR interconnect comprises copper.

12. The solid state camera of claim 6, wherein the printed circuit comprises a flexible printed circuit (FPC).

13. The solid state camera of claim 6, wherein the printed circuit comprises a rigid-flexible printed circuit (RFPC).

14. A miniature camera module, comprising:
a substrate;
an image sensor coupled to the substrate;
an optical train including one or more lenses coupled to the substrate and aligned with the image sensor to define an optical path of the camera module;
an aperture defined along the optical path between at least one lens of the optical train and the image sensor; and
a printed circuit coupled to the image sensor such that a thickness of a printed circuit does not contribute to a physical Z height in addition to a thickness of the substrate.

15. The miniature camera module of claim 14, wherein the printed circuit defines said aperture or a different aperture and is electronically coupled to an active image sensor surface of the image sensor such that the aperture of the printed circuit overlaps an active sensor area along an optical path of the miniature camera.

16. The miniature camera module of claim 14, wherein the printed circuit is electrically coupled to an active image sensor surface of the image sensor at one or both ends such that the printed circuit does not occlude the optical path of the camera module.

17. The miniature camera module of claim 14, further comprising a protective cover over the image sensor that does not contribute to a physical Z height in addition to a thickness of the substrate.

18. The miniature camera module of claim 17, wherein the protective cover comprises an IR filter.

19. The miniature camera module of claim 17, wherein the image sensor also does not contribute to a physical Z height in addition to a thickness of the substrate.

20. The miniature camera module of claim 17, wherein the protective cover further comprises a closest lens of the optical train to the image sensor.

21. The miniature camera module of claim 14, wherein the printed circuit comprises a flexible printed circuit (FPC).

22. The miniature camera module of claim 14, wherein the printed circuit comprises a rigid-flexible printed circuit (RFPC).

23. A miniature camera module, comprising:
a substrate;
an image sensor coupled to the substrate;
an optical train including one or more lenses coupled to the substrate and aligned with the image sensor to define an optical path of the camera module;
an aperture defined along the optical path between at least one lens of the optical train and the image sensor; and
a printed circuit coupled to the image sensor;
wherein at least one lens, of the optical train, that is closest to the image sensor is formed from a protective cover that is disposed over the image sensor, such that a physical Z height is reduced compared with a camera having separate optical elements for protective cover and closest lens to the image sensor.

24. The miniature camera module of claim 23, wherein the at least one lens formed from the protective cover comprises an infrared (IR) filter.

25. The miniature camera module of claim 23, wherein the image sensor and protective cover are coupled together at the wafer stage prior to dicing.

26. The miniature camera module of claim 23, wherein the miniature camera module is configured such that the printed circuit also does not contribute to physical Z height in addition to a thickness of the substrate.

27. The miniature camera module of claim 23, wherein the miniature camera module is configured such that the image sensor also does not contribute to a physical Z height in addition to a thickness of the substrate.

28. The miniature camera module of claim 27, wherein the miniature camera module is configured such that the printed circuit also does not contribute to physical Z height in addition to a thickness of the substrate.

29. The miniature camera module of claim 23, wherein the printed circuit comprises a fold-over flexible printed circuit.

30. A miniature camera module, comprising:
a substrate defining a cavity;
an image sensor coupled to the substrate;
an optical train including one or more lenses coupled to the substrate and aligned with the image sensor to define an optical path of the camera module;
a housing coupled to the substrate and at least partially encompassing the optical train;
an aperture defined along the optical path between at least one lens of the optical train and the image sensor;
a printed circuit coupled to the image sensor; and
a protective cover over an active sensor area of the image sensor and disposed within said cavity of said substrate such that at least a significant portion of a thickness of the protective cover does not contribute to a physical Z height in addition to a thickness of the substrate; and wherein
the miniature camera module is configured such that the printed circuit also does not contribute to the physical Z height of the camera module in addition to the thickness of the substrate.

31. The miniature camera module of claim 30, wherein an entire thickness of the protective cover is disposed within said cavity and does not contribute to the physical Z height in addition to the thickness of the substrate.

32. The miniature camera module of claim 31, wherein the protective cover comprises a closest optic to the image sensor of the optical train.

33. The miniature camera module of claim 30, wherein the protective cover comprises an IR filter.

34. The miniature camera module of claim 30, wherein the printed circuit comprises a fold-over flexible printed circuit.

35. A miniature camera module, comprising:
a substrate defining a cavity;
an image sensor coupled to the substrate and disposed within said cavity such that at least a significant portion of a thickness of the image sensor does not contribute to a physical Z height in addition to a thickness of the substrate;
an optical train including one or more lenses coupled to the substrate and aligned with the image sensor to define an optical path of the camera module;
a housing coupled to the substrate and at least partially encompassing the optical train;
an aperture defined along the optical path between at least one lens of the optical train and the image sensor;
a printed circuit coupled to the image sensor; and
a protective cover over an active sensor area of the image sensor; and wherein
the miniature camera module is configured such that a thickness of the printed circuit does not contribute to physical Z height in addition to the thickness of the substrate.

36. The miniature camera module of claim 35, wherein an entire thickness of the image sensor is disposed within said cavity and does not contribute to the physical Z height in addition to the thickness of the substrate.

37. The miniature camera module of claim 36, wherein at least a significant portion of the protective cover is also disposed within said cavity and does not contribute to the physical Z height in addition to the thickness of the substrate.

38. The miniature camera module of claim 36, wherein an entire thickness of the protective cover is also disposed within said cavity and does not contribute to the physical Z height in addition to the thickness of the substrate.

39. The miniature camera module of claim 35, wherein the protective cover comprises an infrared (IR) filter.

40. A miniature camera module, comprising:
a substrate;
an image sensor coupled to the substrate;
an optical train including one or more lenses coupled to the substrate and aligned with the image sensor to define an optical path of the camera module;
an aperture defined along the optical path between at least one lens of the optical train and the image sensor;
a printed circuit coupled to the image sensor for carrying electronic signals corresponding to image data from the image sensor; and
a protective cover over an active sensor area of the image sensor, and
wherein the miniature camera module is configured such that neither a thickness of (i) the image sensor, (ii) the protective cover, (iii) the printed circuit, nor (iv) a lens of the optical train that is closest to the image sensor contributes to a physical Z height in addition to a thickness of the substrate.

41. The miniature camera module of claim 40, wherein the lens that is closest to the image sensor is formed from the protective cover at the wafer stage before dicing.

42. A miniature camera module, comprising:
a substrate;
an image sensor coupled to the substrate;
an optical train including one or more lenses coupled to the substrate and aligned with the image sensor to define an optical path of the camera module;
an aperture defined along the optical path between at least one lens of the optical train and the image sensor;
a printed circuit coupled to the image sensor for carrying electronic signals corresponding to image data; and
a protective cover over an active sensor area of the image sensor, and
wherein the miniature camera module is configured such that a thickness of the printed circuit does not contribute to a physical Z height in addition to a thickness of the substrate.

43. The miniature camera module of claim 42, wherein a lens of the optical train that is closest to the image sensor is formed from the protective cover.

44. The miniature camera module of claim 43, wherein said closest lens is formed from the protective cover at wafer stage before dicing.

45. A miniature camera module, comprising:
a substrate defining a cavity including an aperture;
an image sensor coupled to the substrate at least partially within the cavity and including an active sensor area overlapping the aperture;
a transparent protective cover coupled to the image sensor over the active sensor area;
an optical housing coupled to the substrate containing therein a train of one or more imaging optics overlapping the aperture and forming an optical path from a first optic of the train through the aperture and transparent protective cover to the active sensor area; and
a flexible printed circuit coupled to the image sensor to carry electrical signals corresponding to image data from the image sensor; and wherein
the transparent cover comprises a lens that is closest to the image sensor such that a physical Z height is reduced compared with a camera module having separate optical elements for the protective cover and the closest lens to the image sensor.

46. The miniature camera module of claim 45, wherein the flexible printed circuit comprises a fold-over flexible printed circuit.

* * * * *